(12) United States Patent
Funaba et al.

(10) Patent No.: US 7,633,147 B2
(45) Date of Patent: Dec. 15, 2009

(54) SEMICONDUCTOR UNIT HAVING TWO DEVICE TERMINALS FOR EVERY ONE INPUT/OUTPUT SIGNAL

(75) Inventors: Seiji Funaba, Tokyo (JP); Hisashi Abo, Tokyo (JP); Takao Ono, Tokyo (JP); Koji Hosokawa, Tokyo (JP); Yoji Nishio, Tokyo (JP); Atsushi Nakamura, Tokyo (JP); Tomohiko Sato, Tokyo (JP)

(73) Assignees: Elpida Memory, Inc., Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 0 days.

(21) Appl. No.: 10/672,551

(22) Filed: Sep. 26, 2003

(65) Prior Publication Data

US 2004/0196682 A1    Oct. 7, 2004

(30) Foreign Application Priority Data

Sep. 26, 2002    (JP) .............................. 2002-281593
Apr. 8, 2003    (JP) .............................. 2003-103681

(51) Int. Cl.
*H01L 23/538* (2006.01)
(52) U.S. Cl. ................ 257/691; 257/685; 257/E23.175
(58) Field of Classification Search ........................ None
See application file for complete search history.

(56) References Cited

U.S. PATENT DOCUMENTS 6,137,164 A * 10/2000 Yew et al. .................... 257/686
6,184,477 B1 * 2/2001 Tanahashi .................... 174/261
6,383,916 B1 * 5/2002 Lin .............................. 438/637
6,630,628 B2 * 10/2003 Devnani et al. .............. 174/255
2001/0002727 A1 * 6/2001 Shiraishi et al. .............. 257/685
2001/0022739 A1 * 9/2001 Funaba et al. .................. 365/63
2001/0024389 A1    9/2001 Funaba et al.
2002/0173133 A1 * 11/2002 Towle et al. .................. 438/612

FOREIGN PATENT DOCUMENTS

| EP | 0818734 A2 | 1/1998 |
| JP | 63-181191 | 7/1988 |
| JP | 8-211975 | 8/1996 |
| JP | 2001-68617 | 3/2001 |
| JP | 2001-256772 | 9/2001 |
| JP | 2001-274323 | 10/2001 |

* cited by examiner

*Primary Examiner*—Sue Purvis
*Assistant Examiner*—Benjamin P Sandvik
(74) *Attorney, Agent, or Firm*—Scully, Scott, Murphy & Presser P.C.

(57) ABSTRACT

A semiconductor unit constituting a memory device has a memory chip, a package substrate having three wiring layers. Power-supply surfaces (VDD surface) and (GND surface) are wired on the package substrate while an intra-package DQ bus is wired on an intermediate layer between both of the power-supply surfaces. The memory device has two DQ pins every one intra-package DQ bus. The intra-package DQ bus is connected to a signal terminal pad of the memory chip through a via hole. In view of the two DW pins, a via hole for connecting the intra-package DQ bus with the signal terminal pad constitutes a branch wire.

10 Claims, 25 Drawing Sheets

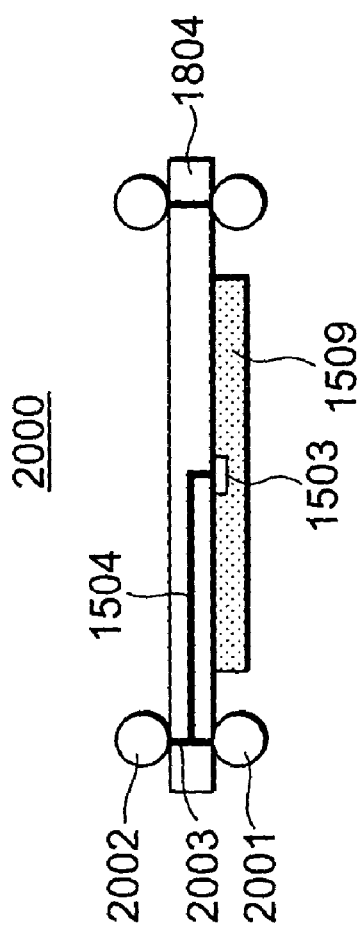
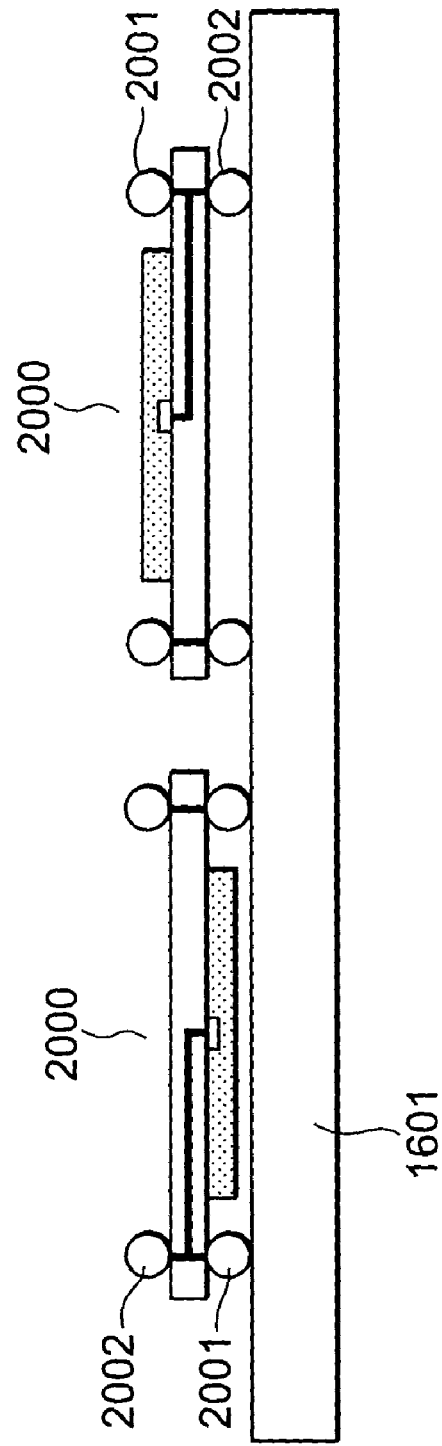

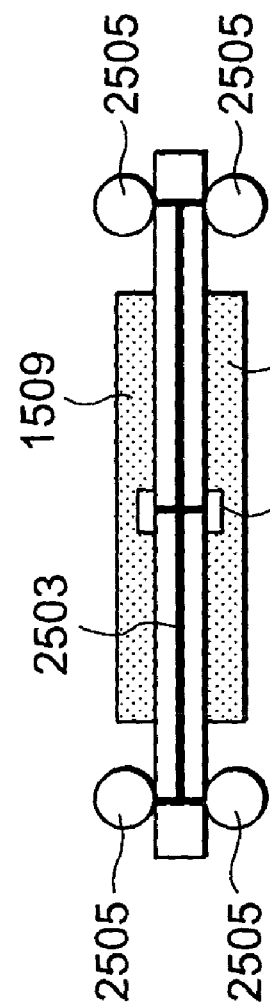
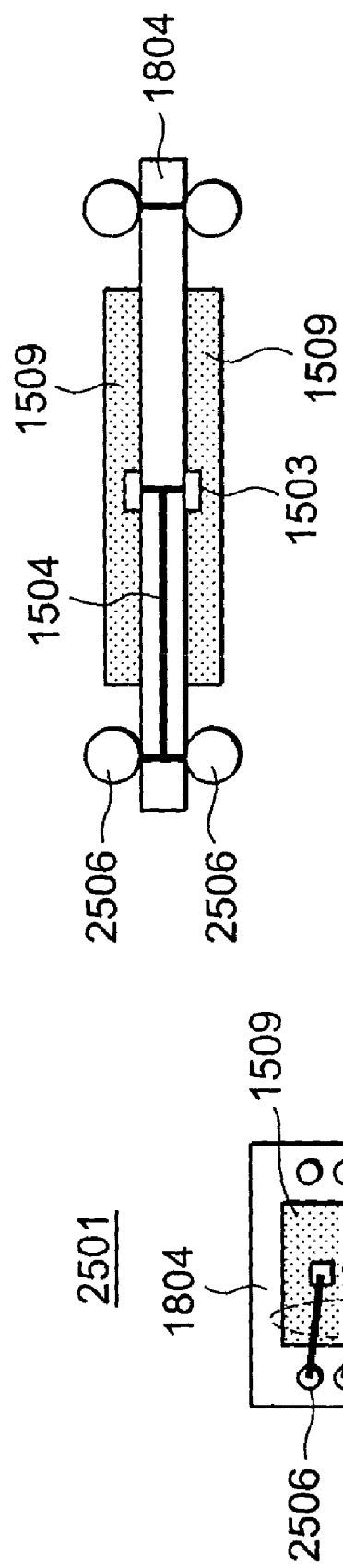
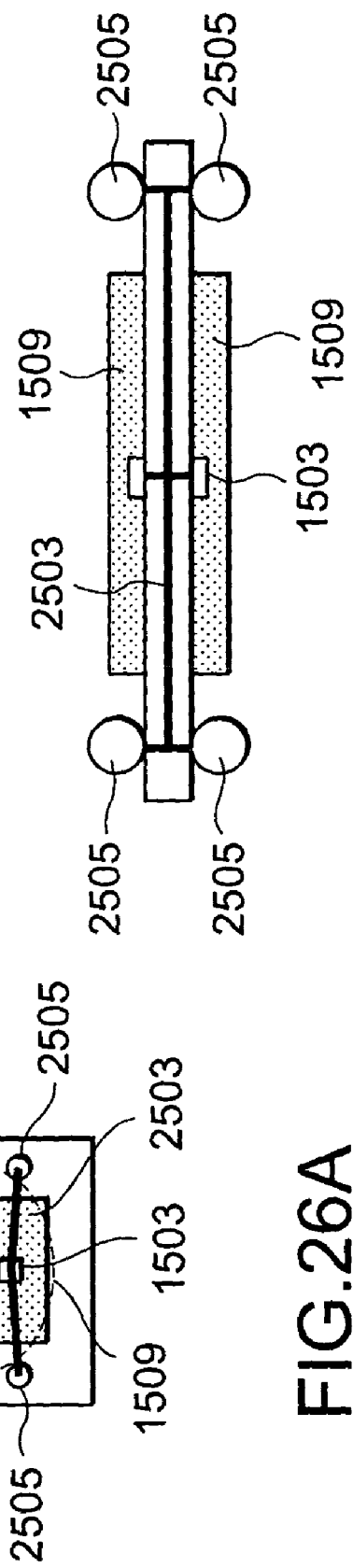

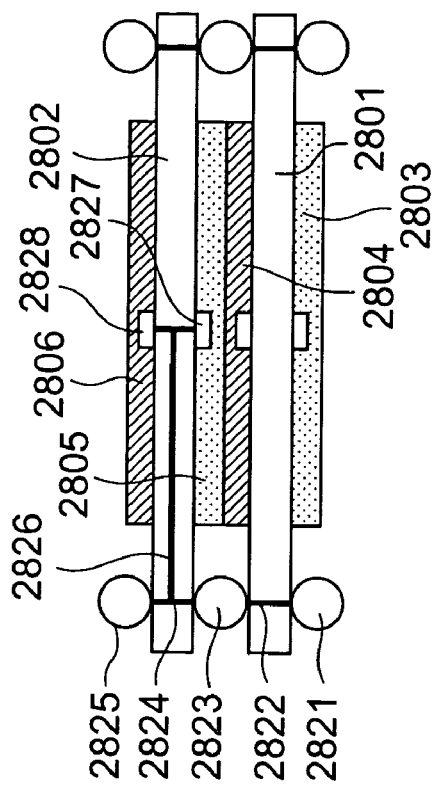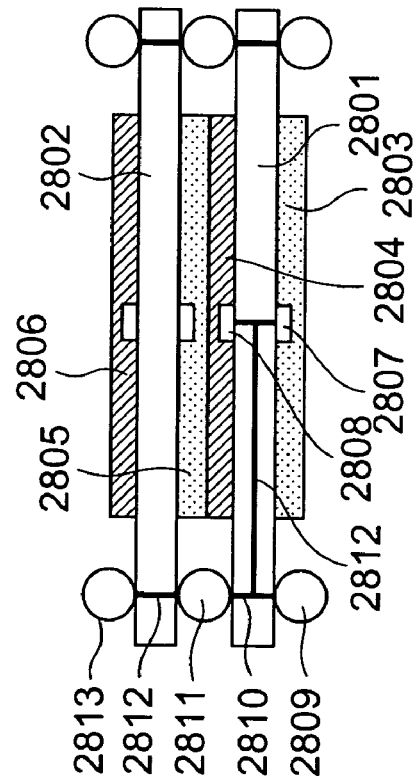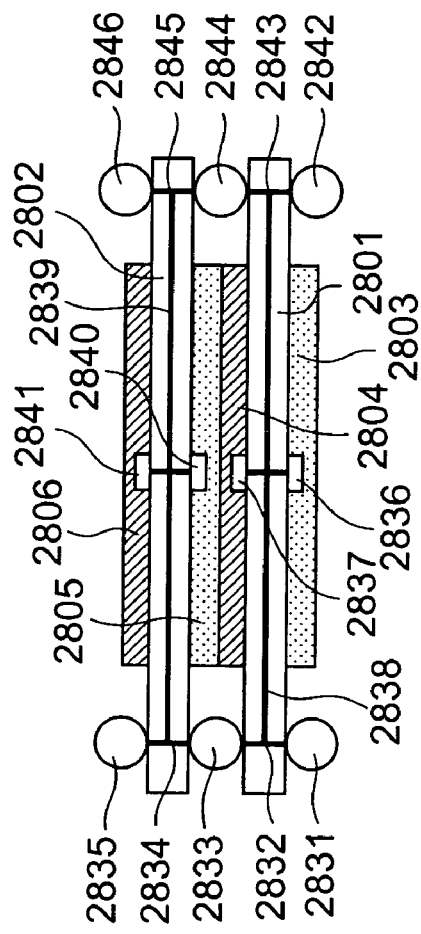
FIG.29A
FIG.29B
FIG.29C

SEMICONDUCTOR UNIT HAVING TWO DEVICE TERMINALS FOR EVERY ONE INPUT/OUTPUT SIGNAL

BACKGROUND OF THE INVENTION

This invention relates to a semiconductor unit, a semiconductor module, and a memory system and, in particular, to a semiconductor unit, a semiconductor module, and a memory system where degradation of data signals or the like hardly occurs on high-speed operation.

Recent years, demand for high-speed becomes high more and more in a memory system. Specifically, in a high-speed memory system, performance coping with a high frequency such as hundreds of MHz through several GHz is required. In general, in the memory system, when a operation frequency becomes high, a waveform is easily confused on propagating of a signal on a wire. Accordingly, device is performed to a signal wiring so that a signal propagates accurately and a high-speed.

For example, United State Patent Application Publication No. US 2001/0024389 A1 discloses a memory system operable at a high-speed in which branches of the signal wiring are cut and reflection of a signal occurring in a branch of a wire is decreased. The memory system disclosed in United State Patent Application Publication No. US 2001/0024389 A1 will later be described in conjunction with FIG. 1. However, when the memory system further operates at the high-speed, problem arise in distortion of the signal waveform generated because the signal reflected at an end portion of an intra-package wire goes and returns the intra-package wire in the manner which will later become clear. In addition, in the memory system where the intra-package wire branches the signal path, there is a limit in a high-speed of the operating frequency.

Japanese Unexamined Patent Publication of Tokkai No. 2001-68617 or JP-A 2001-68617 describes a technique where a plurality of semiconductor elements are laminated in a memory module. In the technique described in JP-A 2001-68617, signal wires which are formed directly below the semiconductor elements, which connect an end of a substrate with another end thereof, and which extend in parallel with the substrate comprise as a line of wires. Signal wires which are formed in a laminating direction though via holes alternately disposed at the end and the other end of the substrate comprise as a line of wires. Such signal wires cope with at the high-speed operation. However, in JP-A 2001-68617, inasmuch as the signal wires extending in parallel with the substrate pass through directly below the semiconductor elements for a long section, problems arise where cross-talk noises (electromagnetic coupling noises) are superimposed from the signal wiring to signal wires within the semiconductor elements and power-supply wires when the operating frequency becomes the high-speed. In addition, problems arise where when laminating of the semiconductor elements are carried out, heat generated from the semiconductor elements concentrates, temperature of the module increases, and degradation of performance is caused.

In a memory module operating at a high-speed, it is necessary to carry out timing control of various signals arriving at a device at a high precision. In order to carry out the timing control at the high precision and to spread both of data wires and command address wires without problem from the point of view of timing error, signal reflection, cross-talk, and so on, an occupied area of the signal wires on the layout increases and degree of freedom of the wires decreases. Specifically, in the command address wires, it is necessary to distribute signals from resisters mounted on the memory module to all of the memory devices, by demands of miniaturization of the module, a large capacity of the memory chip, increase of the number of the command address wires caused by a function extension and so on, problems arise where the occupied area of the wiring further increases, the degree of freedom of the wiring decreases, and the layout is harsh moreover.

In addition, in the conventional memory module, by a restriction of a position relationship between terminals on the module substrate to be wired and terminals on the memory device corresponding thereto and by a restriction of an area which cannot wiring such as a resister IC for a command address signal disposed on the module substrate and a PLL (Phase-Locked Loop) IC for a clock buffer, a drawing of signal wires from terminals of the memory module to terminals of the memory device is complicated and a wiring length of the signal wires may increase. Inasmuch as the above-mentioned signal wires correspond to the branch wires in the memory system having blanches carrying out signal transmission at order of hundreds of MHz, problems arise where increase of the wiring length increases distortion of the signal waveform generated by reflecting and reciprocating of signals within the blanch wires.

EP 0818734 A2 discloses, as a memory system enable at a high-speed operation, an example of the memory system due to high-speed and small-signal-amplitude interface standard SSTL (stub series terminated logic), which was adopted by JEDEC (a lower branch of the Electronics Industries Association in the United States) as an industry standard. The memory system disclosed in EP 0818734 A2 will later be described in conjunction with FIG. 3.

SUMMARY OF THE INVENTION

It is therefore an object of the present invention to provide a semiconductor unit, a semiconductor module, and a memory system, which are capable of shortening a wiring length of a branch wiring in a package or a memory module in the memory system.

It is another object of the present invention to provide a semiconductor unit, a semiconductor module, and a memory system, in which distortion of a signal waveform does not result in malfunction to operation of the memory system on a high-speed operation.

It is still another object of the present invention to provide a semiconductor unit, a semiconductor module, and a memory system, which are capable of defusing an insufficiency of degree of freedom in wirings.

It is yet another object of the present invention to provide a semiconductor unit, a semiconductor module, and a memory system, which are capable of decreasing cross talk noises which are superimposed on a memory device from a signal wiring.

It is a further object of the present invention to provide a semiconductor unit, a semiconductor module, and a memory system, which are capable of suppressing degradation of performance in a device caused by an increase of temperature in the device by improving ability of heat leak.

Other objects of this invention will become clear as the description proceeds.

According to a first aspect of this invention, a semiconductor unit has two device terminals every one input/output signal. The semiconductor unit comprises a laminated substrate and a semiconductor chip. The laminated substrate comprises at least two wiring layer including a signal wiring layer and a power-supply or a ground wiring layer. The semiconductor chip has an input/output pad and is mounted on a main surface of the laminated substrate through the input/output pad. The two device terminals are disposed on the laminated substrate and are connected to both ends of a signal wire in the signal wiring layer. The signal wire is connected to the input/output pad of the semiconductor chip through a via hole.

The semiconductor unit of the first aspect has the two device terminals corresponding to one input/output signal. Each device terminal is mutually connected through the signal wire wired in the signal wiring layer of the laminated substrate (a package substrate). The signal line is connected to the corresponding input/output pad of the semiconductor chip through the via hole (through hole) at a desired position. In view of both device terminals, the wire (via hole) connected to the input/output pad constitutes a branch wire for the signal line formed between the device terminals. Inasmuch as the semiconductor unit has the two device terminals corresponding to one input/output signal, it is possible for the semiconductor unit to supply a signal inputted from one device terminal from the input/output pad to the semiconductor chip through the branch wire and to pick up the signal from another device terminal. Therefore, it is possible to insert the signal wire formed in the semiconductor unit in a data bus instead of branch a signal from the data bus formed on the outside to supply it to the semiconductor unit.

In a conventional structure where one input/output pad is connected to one device terminal, a signal wire in a semiconductor unit extending from the device terminal to the input/output pad constitutes a branch line for a data bus. In the present invention, the wire extending from the signal wire for connecting the two device terminals to the input/output pad of the semiconductor chip constitutes a blanch line. Comparison with the conventional semiconductor unit, it is possible to shorten a wiring length of the wire constituting the branch line for the data bus and a reciprocating time of the signal for the branch line. Therefore, in the semiconductor unit operable at a high-speed, effect of a signal waveform on signal reflection occurring at the branch line is less and operation of the semiconductor unit is not unstable.

In addition, a package substrate comprises at least two wiring layers including the power-supply wiring layer in which a power-supply surface (e.g. VDD surface) and a ground surface (GND surface) are wired. By shielding the signal wiring layer by the power-supply wiring layer, it is possible to decrease a cross talk which invades the semiconductor chip from an input/output signal line. It is preferable that the branch wire substantially comprises only the via hole.

According to a second aspect of this invention, a semiconductor unit has two device terminals every one input/output signal. The semiconductor unit comprises a laminated substrate and a semiconductor chip. The laminated substrate comprises at least two wiring layers including a signal wiring layer and a power-supply or a ground wiring layer. The semiconductor chip has an input/output pad and is mounted on a main surface of the laminated substrate through the input/output pad. The semiconductor chip has two input/output pods connected to both ends of an intra-chip wire. The two device terminals are connected to the two input/output pads through corresponding signal wires in the signal wiring layer and via holes, respectively.

The semiconductor unit of the second aspect of this invention has the two device terminals corresponding to one input/output signal. Each device terminal is connected through the signal wire to each input/output pad of the semiconductor chip which has the two input/output pads corresponding to one input/output signal. In the semiconductor chip, the input/output pads are mutually connected through the intra-chip wiring and the signal line formed between both device terminals is comprised as a line of wires. For instance, it will be assumed that a signal is supplied from the data bus formed in the outside to one input/output pad of the semiconductor chip. In this event, an input signal is supplied from the one input/output pad to the semiconductor chip and produces from another device terminal through the intra-chip wire and another input/output pad.

It is therefore possible further to shorten the wiring length of the wire comprising the branch line for the data b us and the reciprocating time of the signal for the branch line further shortens. Accordingly, in the semiconductor unit operable at a high-speed, effect of signal waveform on signal reflection occurring in the branch line is less and operation of the semiconductor unit is not unstable. In addition, a package substrate comprises at least two wiring layers including the power-supply wiring layer in which a power-supply surface (e.g. VDD surface) and a ground surface are wired. By shielding the signal wiring layer by the power-supply wiring layer, it is possible to decrease a cross talk which invades the semiconductor chip from an input/output signal line.

According to a third aspect of this invention, a semiconductor unit has two device terminals every one input/output signal. The semiconductor unit comprises a semiconductor chip, at least one input/output signal chip pad of the semiconductor chip, and a wire for selectively connecting the chip pad with one of the two device terminals that has an electrical connection for a semiconductor module.

The semiconductor unit of the third aspect of this invention has the two device terminals corresponding to one input/output signal and can select the device terminal which is electrically connected to the semiconductor module. It is therefore possible to selectively wire the device terminal which can shorten a wiring length on the semiconductor module. Inasmuch as there is no wire between the chip pad and another device terminal having no electrical connection for the semiconductor module in the two device terminals corresponding to the chip pad, the semiconductor unit does not have an excessive wiring capacitance and an excessive wiring inductance. It is therefore possible to decrease the signal reflection.

According to a fourth aspect of this invention, a semiconductor unit has two device terminals every one input/output signal. The semiconductor unit comprises a semiconductor chip and the two device terminals connected to at least one input/output signal chip pad of the semiconductor chip. The two device terminals are disposed on a main surface and a back surface of the semiconductor unit at one side opposite to each other one by one.

The semiconductor unit of the fourth aspect of this invention comprises the two device terminals disposed on the main and the back surfaces of the semiconductor unit at one side opposite to each other corresponding to one input/output signal one by one. On mounting the semiconductor unit on a semiconductor module, it is possible to alter a position of the device terminals in a case where the main surface of the semiconductor unit is disposed so as to look upward and a case where the back surface of the semiconductor unit is disposed so as to look upward. It is therefore possible to selectively wire a mounting method which can shorten the wiring length on the semiconductor module. Inasmuch as a length of a wire between the chip pad and another device terminal having directly no connection for a memory module in the two device terminals corresponding to the chip pad is less than a thickness of the semiconductor unit, an excessive wiring capacitance and an excessive wiring inductance, which are caused by the wire for the device terminal which is directly not connected to the semiconductor module, are very little. It is therefore possible to decrease the signal reflection.

In the semiconductor unit of the first and the second aspects of this invention, the signal wiring layer may form a micro strip line together with the ground wiring layer in the laminated substrate and the ground wiring layer may disposed between the signal wiring layer and the semiconductor chip. Alternatively, the signal wiring layer may be sandwiched between the power-supply wiring layer and the ground wiring layer in the laminated substrate to form a strip line together with the power-supply wiring layer or the ground wiring layer. In these events, inasmuch as a rate of metal included in a package substrate adjacent to the semiconductor chip is large, it is possible to smoothly carry out radiation of heat and it is possible to prevent operation of the semiconductor chip from being unstable caused by rising temperature of the semiconductor chip.

In the semiconductor unit of the first and the second aspects of this invention, the laminated substrate may have a size larger than a plan size of the semiconductor chip and the semiconductor unit may have further two device terminals formed on a main surface of the laminated substrate that are opposite to the two device terminals formed on a back surface of the laminated substrate. In this event, the semiconductor unit has a maximum of four device terminals every one input/output signal. On laminating the semiconductor units, it is possible to connecting two device terminals with combined among one and another device terminals on the main surface and one and another device terminals on the back surface for the same input/output signal. The semiconductor unit may have device terminals directly connected through via holes between the device terminals on the main surface and the device terminals on the back surface without connecting with a signal wire.

In the semiconductor unit of the first aspect of this invention, the semiconductor chip may comprise an input/output circuit corresponding to the input/output pad that comprises at least one of an input buffer and an output buffer, an input protection resistor, and an electrostatic protection element.

In the semiconductor unit of the second aspect of this invention, the semiconductor chip may comprise an input/output circuit corresponding to the two input/output pads that comprises at least one of an input buffer and an output buffer, an input protection resistor, and an electrostatic protection element and the input/output circuit may be connected to the intra-chip wire through a different intra-chip wire.

It is preferably that the semiconductor unit of the first and the second aspects of this invention is operable in response to a clock signal and a distance L between the input/output circuit and the signal wire is satisfied to a cycle time tck of the clock signal determined by a product specification of the semiconductor unit with a relationship as follows:

$$2 \times 2L \times 7 \text{ ns/m} < tck/10.$$

It will be assumed that tR represents a signal rise time and rS represents a signal reciprocating time required for going and returning the signal through a branch wire. When the signal rise time rR is not more than twice the signal reciprocating time rS, namely, when the signal reciprocating time rS is not less than a half of the signal rise time rR, distortion of signal waveform becomes obvious. It will be assumed that a time required to propagate a signal for a unit distance is 6-7 (ns/m) and the signal rise time tR is about one-tenths of a period of an operating clock signal. When the relationship of $2 \times 2 \, L \times 7$ ns/m<tck/10 is satisfied, distortion of signal waveform does not effect operation of the semiconductor unit and good operation can be made.

According to this invention, a semiconductor module comprises a module substrate and a plurality of semiconductor units. The module substrate comprises a connector and an intra-module wire connected to the connector. The semiconductor units are mounted on a main surface and a back surface of the module substrate and are connected to the intra-module wire. Each of the semiconductor units is comprised as the semiconductor unit according to the first or the second aspect of this invention. One pair of the two device terminals of two semiconductor units disposed on the main surface and the back surface of the module substrate opposite to each other are mutually connected through a via hole while another pair of the two device terminals are connected to the connector through intra-module wires disposed in the main surface and the back surface of the module substrate, respectively.

In the semiconductor module of a first aspect of this invention, module outer wires and the intra-module wires are connected by the connector on the main surface and the back surface of the module substrate and respective intra-module wires are connected to the one pair of the device terminals of the semiconductor unit of the first or the second aspects mounted on the main surface and the back surface of the module substrate. Another pair of the device terminals of the two semiconductor units mounted on the main surface and the back surface of the module substrate are connected to each other through a via hole for connecting between the main surface and the back surface of the module substrate. With this structure, it is possible to constitute wires extending from the connector of the main surface side to the connector of the back surface side as a line of wires and a high-speed operation is enable by deleting branch positions. Inasmuch as it is unnecessary to wire, directly under the semiconductor unit, the intra-module wire corresponding to a signal supplied to the semiconductor unit, it is possible to dispose other wires such as control wires directly under the semiconductor unit and degree of freedom on wiring layout is improved.

A semiconductor module of a second aspect of this invention comprises the module substrate and a plurality of semiconductor units. The module substrate comprises a connector and intra-module wires connected to the connector. The semiconductor units are mounted on the main surface and the back surface of the module substrate and are connected to the intra-module wires. The semiconductor units can form device terminals on a main surface and a back surface thereof. The semiconductor units are laminated. The device terminal formed on the back surface of the semiconductor unit of an upper layer is connected to the device terminal formed on the main surface of the semiconductor unit of a lower layer.

In the semiconductor module of the second aspect of this invention, the intra-module wire is connected to one device terminal formed on the back surface of the semiconductor units which are mounted on the main surface and the back surface of the module substrate and in which the device terminals are formed on the main surface and the back surface thereof. The semiconductor units are laminated on the module substrate. Signal wires formed in the semiconductor units are connected so as to constitute a line of wires by suitably connecting one and another device terminals formed on the main surface and the back surface of the semiconductor unit. In this event, branch positions in the semiconductor units laminated decrease and a high-speed operation can be carried out.

In the semiconductor module of the second aspect of this invention, it is preferable that one pair of the two device terminals in two semiconductor units disposed on the main surface and the back surface of the module substrate opposite to each other are mutually connected through a via hole while another pair of the two device terminals are connected to the connector through intra-module wires disposed on the main surface and the back surface of the module substrate. In this event, inasmuch as it is possible to shorten a wiring length of branch wires included in the signal wires extending from the connector of the main surface side of the module to the connector of the buck surface side of the module, a high-speed operation can be carried out although the semiconductor units are laminated. Inasmuch as it is unnecessary to wire, directly under the semiconductor unit, the intra-module wires corresponding to a signal supplied to the semiconductor unit, it is possible to dispose other wires such as control wires or the line directly under the semiconductor unit without increasing the wiring layer and degree of freedom on wiring layer is improved.

In the semiconductor modules of the first and the second aspect of this invention, it is possible to constitute the module substrate as a different laminated substrate. In this event, it is possible to shield the intra-module wires by the power-supply surface and the ground surface to form a strip line or a micro strip line.

In the semiconductor modules of the first and the second aspects of this invention, the semiconductor unit may be comprised as a memory device.

The semiconductor modules of the first and the second aspects of this invention may adopt a structure where the semiconductor module further comprises a register mounded on the module substrate and a control wire between the register and the plurality of memory devices passes through between the two device terminals. In this event, inasmuch as the signal wire and the control wire do not intersect to each other on the module substrate, it is possible to lower a characteristic impedance by making a size of the control wire larger.

A semiconductor module of a third aspect of this invention comprises a module substrate and a plurality of semiconductor units. The module substrate comprises a connector and intra-module wires connected to the connector. The semiconductor units are mounted on a main surface and a back surface of the module substrate and are connected to the intra-module wires. The semiconductor unit is comprised as the semiconductor unit of the first, the third, or the fourth aspects of this invention. The device terminals of the semiconductor unit are selectively connected so as to shorten a wiring length of wires which extend from a module terminal of the semiconductor module to the semiconductor unit.

A memory system according to this invention comprises a mother board having mother board wires, a controller mounted on the mother board, a plurality of semiconductor modules which are mounted on the mother board in turn and which are connected to the controller through the mother board wires in turn, and terminating resistors connected to terminations of the mother board wires. The semiconductor module comprises the semiconductor module of the first or the second aspects of this invention. The mother board wires are connected through the intra-module wires in a chain fashion.

In the memory system according to this invention, inasmuch as it adopts the semiconductor modules which are comprised as the semiconductor modules of the first or the second aspects of this invention, it is possible to shorten a wiring length of branch wires which lie in a signal path extending from the controller to the terminating resistor and a high-speed operation can be carried out.

A term of "a line of wires" used throughout this specification means a signal wire on which a signal substantially propagates only in one direction without any branch and any loop in a wiring path.

BRIEF DESCRIPTION OF THE DRAWINGS

FIGS. 23A and 23B are sectional views showing structure of a memory package of a first embodiment of a semiconductor unit according to a fourth aspect of this invention;

FIG. 26A is a plan view of a first embodiment of a laminated memory having both the first and the fourth aspects of this invention;

FIGS. 26B and 26C are sectional views of the laminated memory illustrated in FIG. 26A;

FIGS. 29A, 29B, and 29C are sectional views of an embodiment of a laminated memory mounting four devices, having both the first and the fourth aspects of this invention.

DESCRIPTION OF THE PREFERRED EMBODIMENTS

Figure 1:
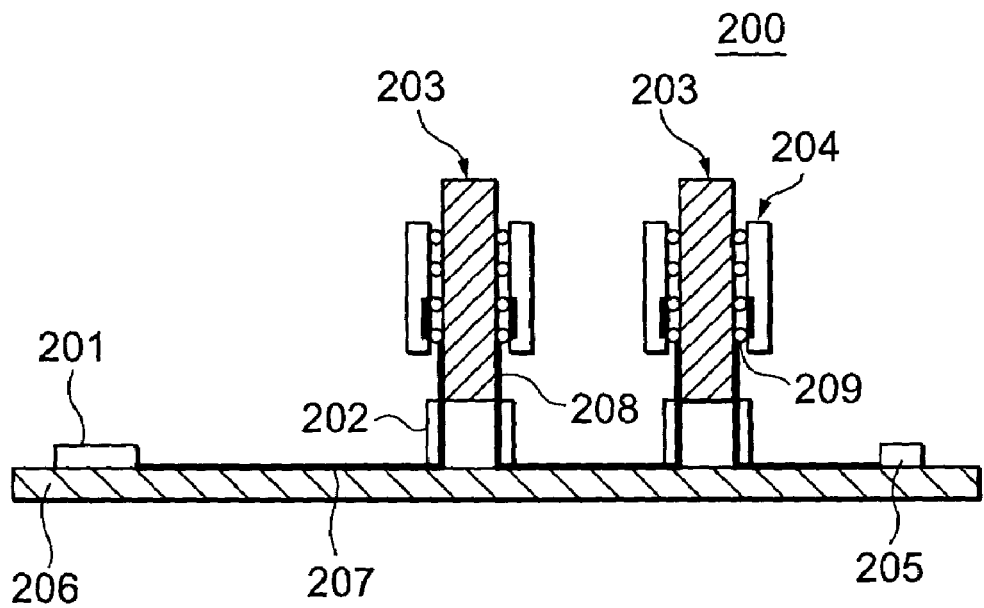
FIG. 1 is a sectional view showing a signal wiring path in a conventional memory system.
Figure 21A:
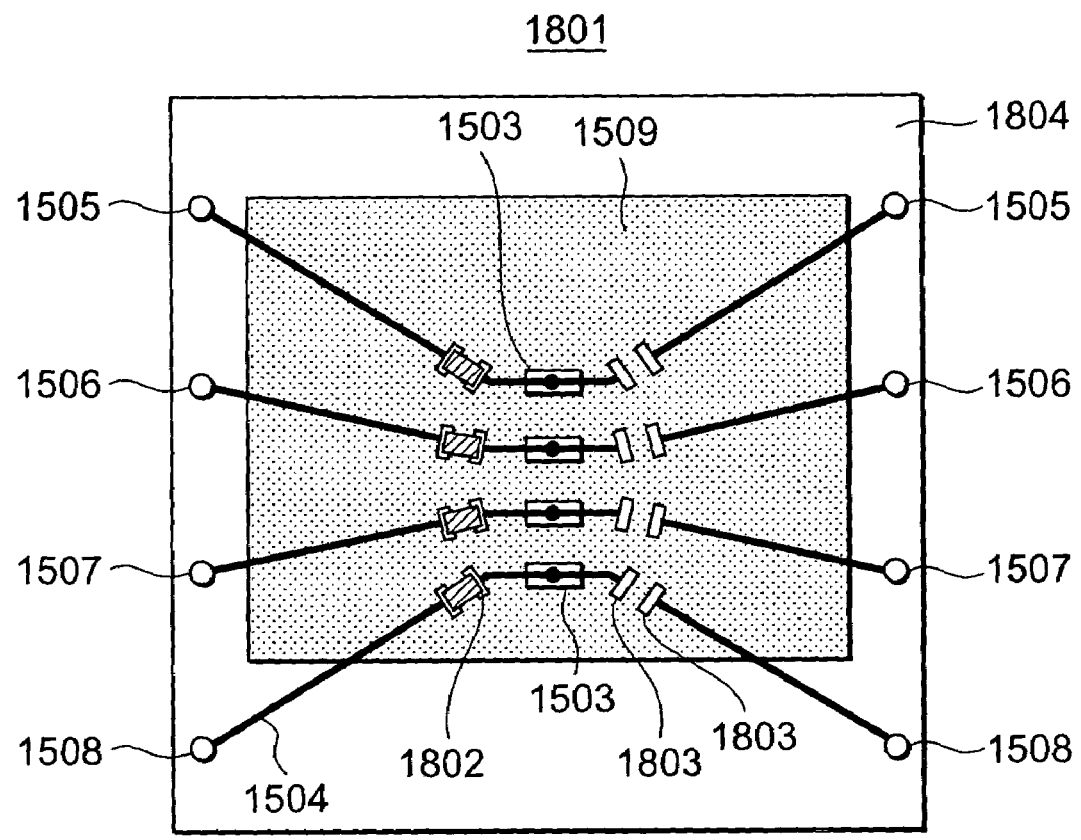
FIG. 21A is a plan view showing structure of a memory package of a third embodiment of a semiconductor unit according a third aspect of this invention.

Referring to FIG. 1, a first conventional memory system will be described at first in order to facilitate an understanding of the present invention. FIG. 1 is a cross sectional view of signal wiring paths in the first conventional memory system disclosed in FIG. 21A of United State Patent Application Publication No. US 2001/0024389 A1.

A memory system 200 comprises a memory controller 201, a plurality of memory modules 203, and a terminal resistor 205. Each of the memory modules 203 mounts a memory device 204 thereon.

The memory system 200 is mounted on a motherboard 206. Each element of the memory system 200 is connected to another element through a signal wire 207 and a command address wire (not shown). A module socket 202 holds the corresponding memory module 203 and connects the signal wire 207 with an intra-module wire 208. Each memory module 203 comprises a module substrate and a plurality of memory devices 204 mounted on the module substrate.

The memory controller 201 controls whole of the memory system 200 through the signal wire 207. The memory controller 201 reads data out of the memory device 204 mounted on a desired memory module 203 and writes data in the memory device. The signal wire 207 and the intra-module wire 208 are controlled so that its wiring impedance has a desired value and prevents signal reflection or the like caused by impedance mismatching. Each memory device 204 is connected to the intra-module wire 208 on the module substrate through a device terminal 209 which comprises, for example, a solder ball. The terminal resistor 205 terminates the signal wire 207 and prevents reflection of the signal in a wiring terminal portion.

Figure 2:
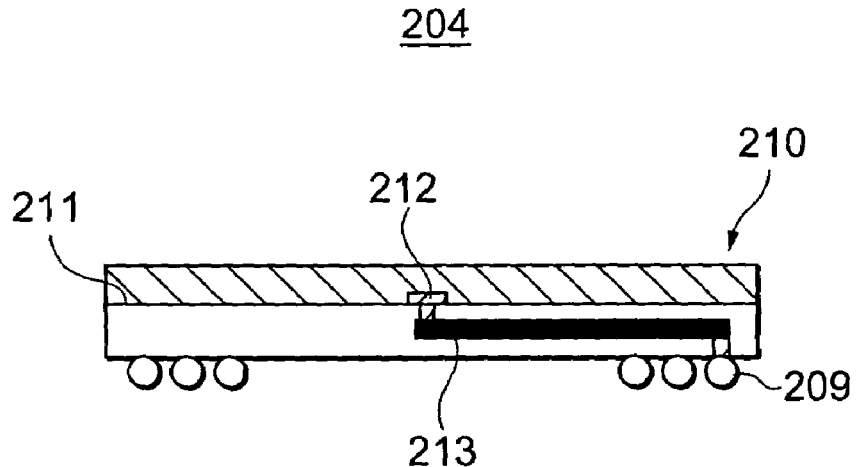
FIG. 2 is a sectional view showing details of a memory device for use in the memory system illustrated in FIG. 1.

FIG. 2 shows details of the memory device 204 illustrated in FIG. 1. The memory device 204 is composed as a memory chip 210 mounted on a package substrate 211. In the package substrate 211, an intra-package wire 213 is wired. The intra-package wire 312 has an impedance of a controlled desired value. The package substrate 211 has an end connected to the device terminal 209. The package substrate 211 has another end connected to a signal terminal pad 212 through a via hole. The signal terminal pad 212 is composed as an input/output terminal of the memory chip 210.

The device terminals 209 and the signal terminal pads 212 have one-to-one relationship. An input signal from a device terminal 209 is supplied to the signal terminal pad 212 through the intra-package wire 313 corresponding to the device terminal 209 in question. The intra-package wire 213 has a wiring length which is determined by a position relationship between the device terminal 209 and the signal terminal pad 212 corresponding to the device terminal 209 in question. In the memory system 200 in FIG. 1, only the intra-package wires 213 substantially comprise branch wires in wires between the memory controller 201 and the terminal resistor 205.

In the manner which is described above, in technique described in United State Patent Application Publication No. US 2001/0024389 A1, by constructing the signal path from the memory controller 201 to the terminal resistor 205 at a line of wires without branching, it makes less reflection of a signal generated at a wiring branch place, makes disturbance of the signal minimum, and it is possible to operate at a high-speed.

In the manner which is described above, in the memory system 200, the intra-package wire 213 constitutes a branch wiring for the signal wire 207 and the intra-module wire 208. Inasmuch as the intra-package wire 213 is comprised of a wire having a sufficiently short length, the signal reflection generated at an end portion of the intra-package wire 213 becomes no issue when the operating frequency has a low. However, when the memory system 200 further operates at the high-speed, problem arise in distortion of the signal waveform generated because the signal reflected at the end portion of the intra-package wire 213 goes and returns the intra-package wire 213.

It will be assumed that the intra-package wire 312 has the wiring length of 10 mm and the signal propagating in the wiring has a propagation time per unit distance of 6 ns/m. In this event, a time tS required where the signal goes and returns the intra-package wire 213 is 120 ps. When a rising time tR of the propagating signal is not more than twice of the signal reciprocating time tS, the effect on the signal waveform becomes large and the distortion of the waveform caused by the signal reflection becomes obvious. It will be assumed that the rising time rR of the signal is about one-tenths of the operating frequency. When the operating frequency is 100 MHz, the rising time tR of the signal is about 1 ns. When the operating frequency is 1 GHz, the rising time tR of the signal is about 100 ps. When the operating frequency is about 100 MHz, the signal reciprocating time tS is sufficiently short compared with the rising time tR and the distortion of the signal hardly becomes issue. When the operating frequency approaches to order of GHz, a difference between the signal reciprocating time tS and the rising time tR becomes small and the distortion of the signal becomes issue.

In order to realize a stable high-speed operation in the memory system 200, the wiring length of the intra-package wire 213 comprising the branch wiring may be as short as possible. However, when the intra-package wire 213 has the wiring length determined by a position relationship between the device terminal 209 and the signal terminal pad 212 corresponding to the device terminal 209 in the manner which is described above, there is a restriction on a layout and it is impossible to arbitrarily set the wiring length. Accordingly, in the conventional memory system 200 where the intra-package wire 213 branches the signal path, there is a limit in a high-speed of the operating frequency.

Japanese Unexamined Patent Publication of Tokkai No. 2001-68617 or JP-A 2001-68617 describes a technique where a plurality of semiconductor elements are laminated in a memory module. In the technique described in JP-A 2001-68617, signal wire which are formed directly below the semiconductor elements, which connect an end of a substrate with another end thereof, and which extend in parallel with the substrate comprise as a line of wires. Signal wires which are formed in a laminating direction though via holes alternately disposed at the end and the other end of the substrate comprise as a line of wires. Such signal wires cope with at the high-speed operation. However, in JP-A 2001-68617, inasmuch as the signal wires extending in parallel with the substrate pass through directly below the semiconductor elements for a long section, problems arise where cross-talk noises (electromagnetic coupling noises) are superimposed from the signal wiring to signal wires within the semiconductor elements and power-supply wires when the operating frequency becomes the high-speed. In addition, problems arise where when laminating of the semiconductor elements are carried out, heat generated from the semiconductor elements concentrates, temperature of the module increases, and degradation of performance is caused.

In a memory module operating at a high-speed, it is necessary to carry out timing control of various signals arriving at a device at a high precision. In order to carry out the timing control at the high precision and to spread both of data wires and command address wires without problem from the point of view of timing error, signal reflection, cross-talk, and so on, an occupied area of the signal wires on the layout increases and degree of freedom of the wires decreases. Specifically, in the command address wires, it is necessary to distribute signals from resisters mounted on the memory module to all of the memory devices, by demands of miniaturization of the module, a large capacity of the memory chip, increase of the number of the command address wires caused by a function extension and so on, problems arise where the occupied area of the wiring further increases, the degree of freedom of the wiring decreases, and the layout is harsh moreover.

In addition, in the conventional memory module, by a restriction of a position relationship between terminals on the module substrate to be wired and terminals on the memory device corresponding thereto and by a restriction of an area which cannot wiring such as a resister IC for a command address signal disposed on the module substrate and a PLL (Phase-Locked Loop) IC for a clock buffer, a drawing of signal wires from terminals of the memory module to terminals of the memory device is complicated and a wiring length of the signal wires may increase. Inasmuch as the above-mentioned signal wires correspond to the branch wires in the memory system having blanches carrying out signal transmission at order of hundreds of MHz, problems arise where increase of the wiring length increases distortion of the signal waveform generated by reflecting and reciprocating of signals within the blanch wires.

EP 0818734 A2 discloses, as a memory system enable at a high-speed operation, an example of the memory system due to high-speed and small-signal-amplitude interface standard SSTL (stub series terminated logic), which was adopted by JEDEC (a lower branch of the Electronics Industries Association in the United States) as an industry standard.

Figure 3:
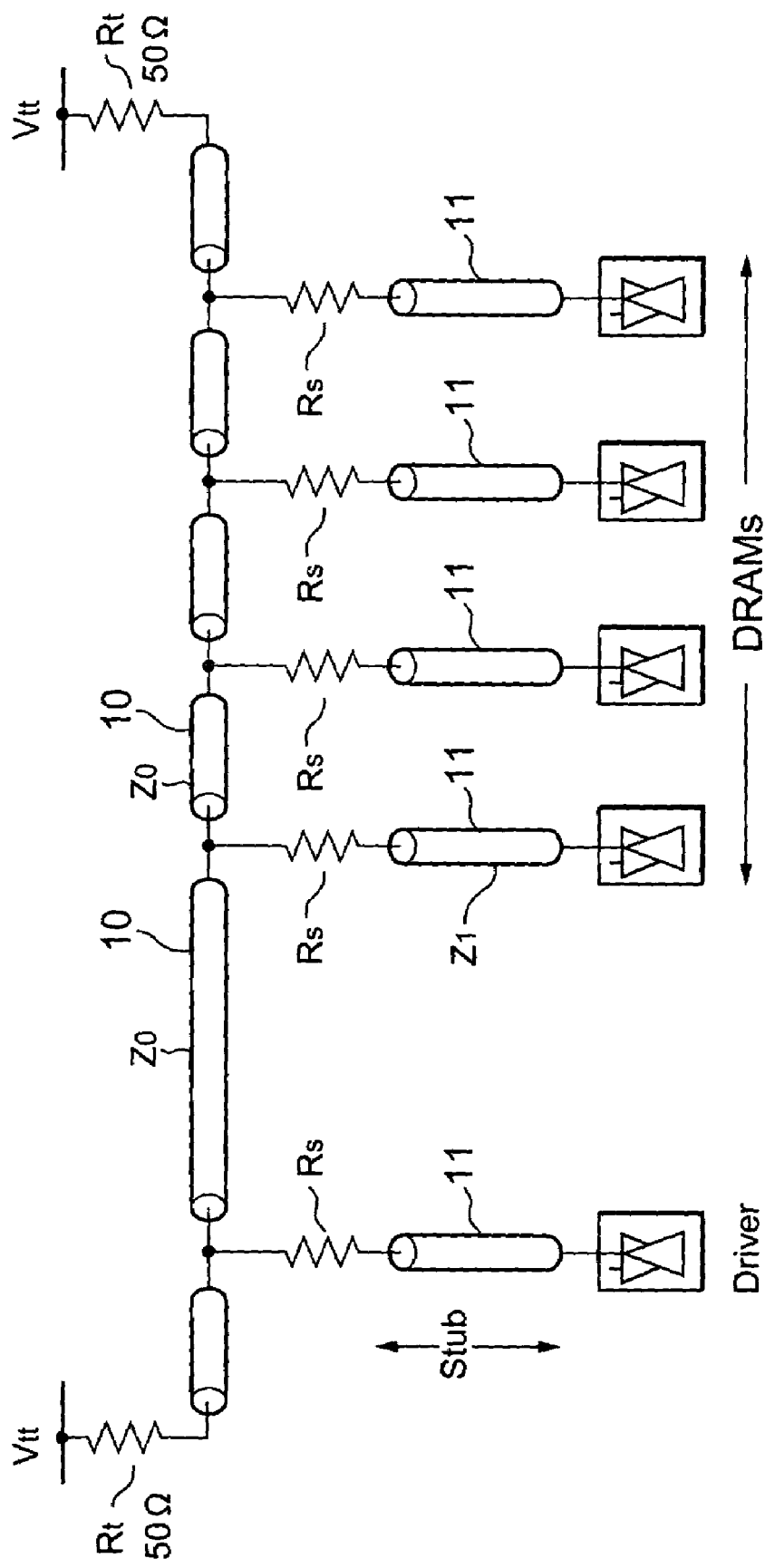
FIG. 3 is an illustrative view showing a bus configuration of SSTL illustrated in EP0818734A2.

FIG. 3 is an illustrative drawing showing a bus configuration of SSTL.

As shown in FIG. 3, SSTL inserts resistance Rs between a bus 10 having a characteristic impedance $Z_0$ and a stub (branch from the bus 10) 11 having a characteristic impedance $Z_1$. This resistance Rs has a resistance value related as: $Z_0/2+Rs=Z_1$.

In this case, a signal reflected at a device end and returning to the bus 10 will not be reflected again at the connection between the stub 11 and the bus 10, because impedance matching is in place between the stub 11 and a point beyond (bus 10). This prevents transient responses from interfering with transmitted signals, thereby achieving high-speed data transfer. SSTL also connects the bus 10 to the termination voltage Vtt via termination resistances Rt as shown in FIG. 3. The termination voltage Vtt is set lower than a power voltage level. Choice of an appropriate value for the termination resistance Rt can prevent signal reflections at the end points of the bus 10.

In practice, the termination voltage Vtt is substantially 1.5V, and a reference voltage Vref used in receivers (input units for receiving signals from the bus) is also substantially set to 1.5V. The termination resistance Rt is about 50Ω and the resistance Rs is approximately 25 Ω.

Figure 4:
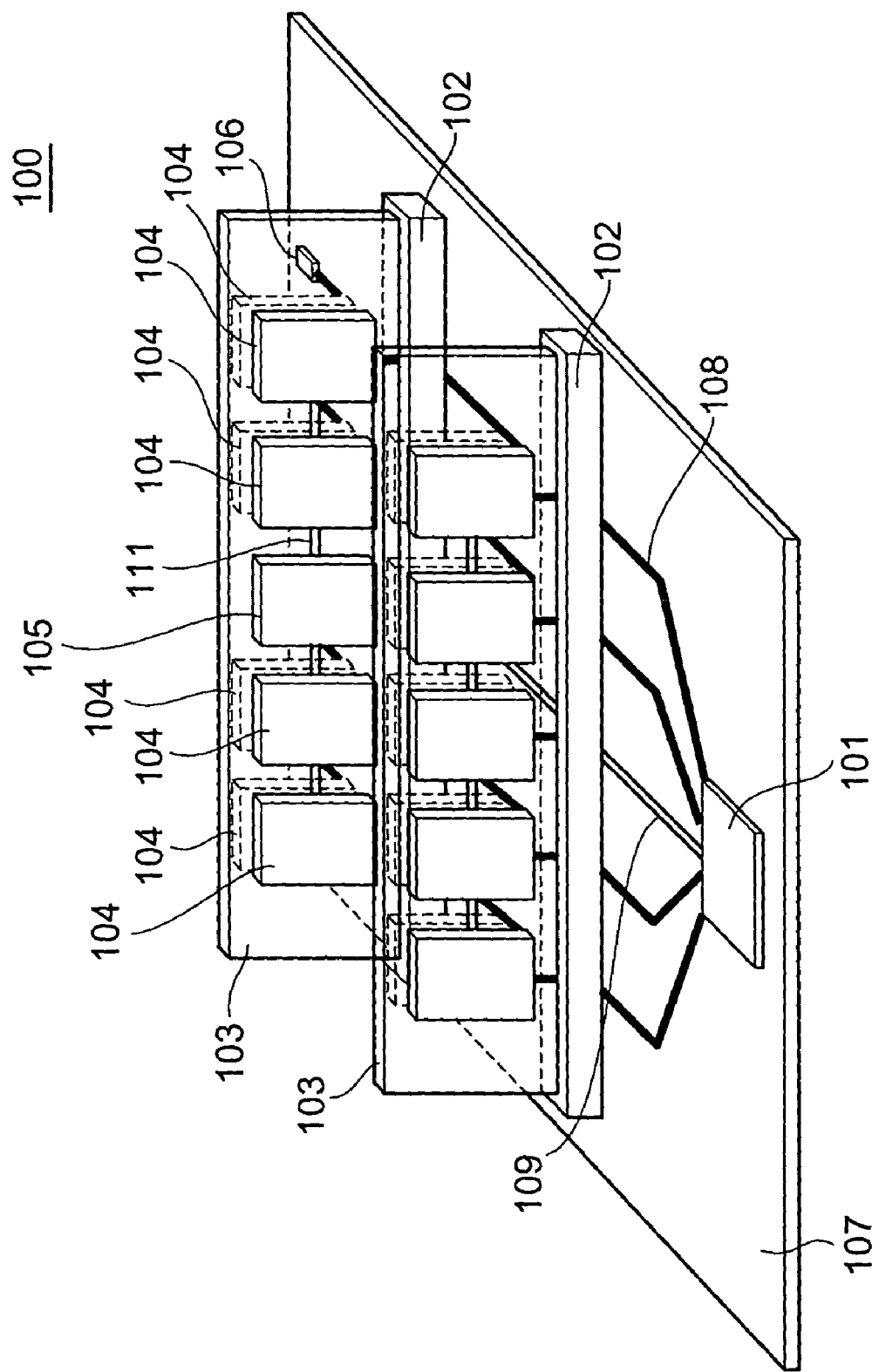
FIG. 4 is a perspective view showing a structure of a memory system according to a first embodiment of this invention.
Figure 5:
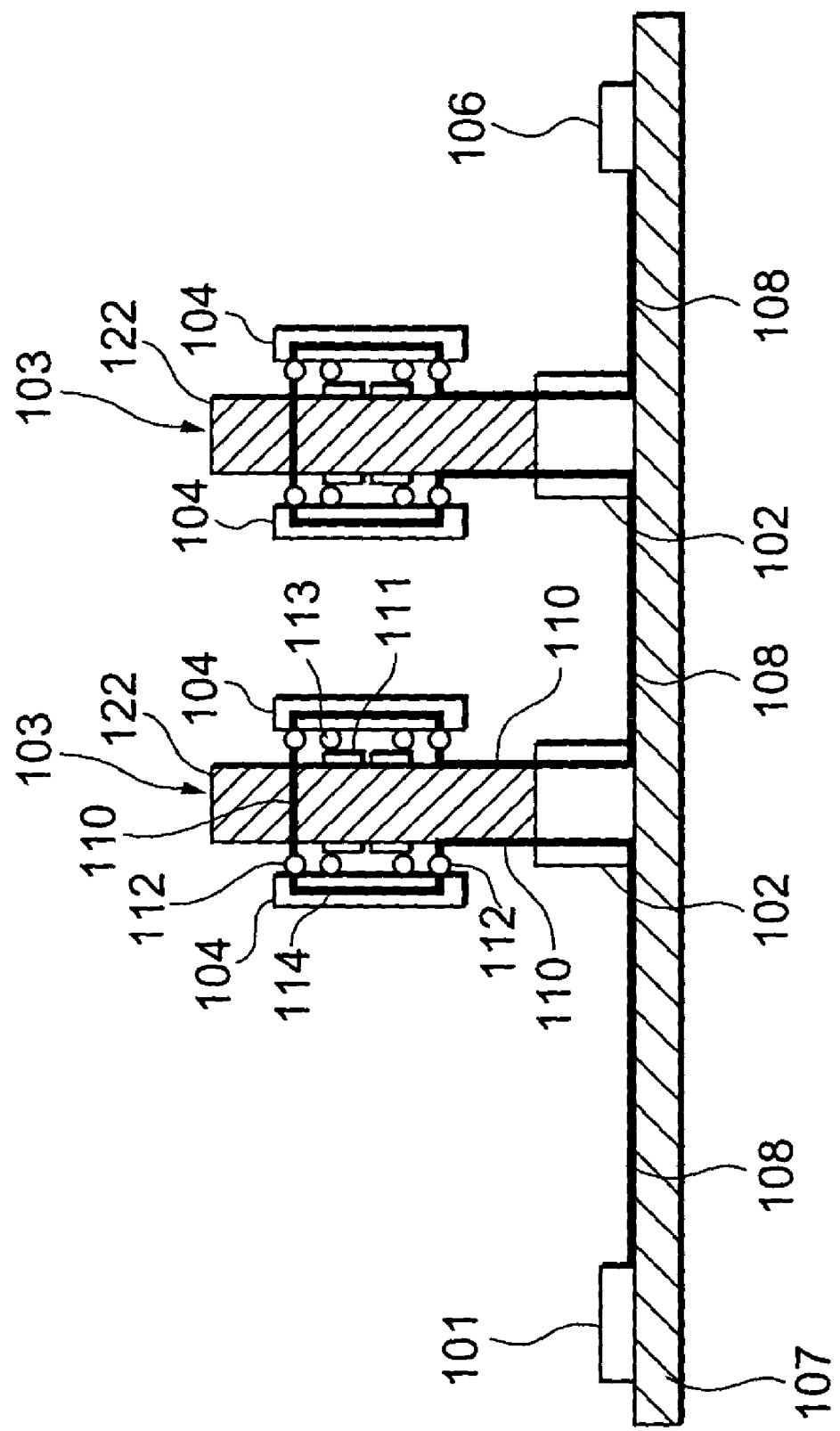
FIG. 5 is a sectional view taken along a DQ bus of the memory system illustrated in FIG. 4.

Referring to FIGS. 4 and 5, the description will proceed to a memory system according to a first embodiment of this invention. FIG. 4 is a perspective view of a memory system 100 according to the first embodiment of this invention. FIG. 5 is a sectional view taken along a direction of a DQ bus 108 of the memory system 100. The memory system 100 comprises a memory controller 101, memory modules 103 each comprising memory devices 104 and resisters 105, and terminating resistors 106.

The memory controller 101 controls the whole of the memory system 100. Each memory module 104 mounts the resistor 105 and a plurality of memory devices 104 thereon. Module sockets 102 are disposed corresponding to the memory modules 103 and electrically connect each wiring on a mother board 107 with each wiring in the memory modules 103. The memory controller 101 is connected to the memory devices 104 through DQ buses (date buses) 108 having a band corresponding to a predetermined data length and is connected to the resister 105 through a CA bus (control signal bus) 109.

The CA bus 109 branches at the resister 105 and is distributed to the memory devices 104 in the memory module 103 through an intra-module CA bus 111. The DQ buses 108 are wired in a plurality of systems. Each DQ bus 108 connects the plurality of memory devices 104 in series (in cascade). In the example being illustrated in FIG. 4, four DQ buses 108 are wired and each DQ bus 108 connects four memory devices 104 in series as shown in FIG. 5.

Signals produced by the memory controller 101 are terminated at the terminating resistors 106 which are disposed in respective terminating portions of the DQ buses 108 and the CA bus 109. Produced by the memory modules 103 toward the memory controller 101, signals are terminated in the memory controller 101 or terminating resistors (not shown) disposed adjacent to the memory controller 101.

Signal wires in the memory system 100 are wired so as to have the same impedance and each terminating resistor 106 has a resistance value which matches with a characteristic impedance of the signal wiring. At positions where components such as module sockets 102 having difficult impedance matching with the signal wires locally exist in the signal wires independently, impedance is effectively matched by adding capacitance elements adjacent thereto. Inasmuch as the memory looks a capacitance load, impedance effectively is matched by lowering a capacitance component of a wiring adjacent thereto (loaded section) or by heightening an inductance component thereof, namely, by heightening the characteristic impedance.

In the memory system 100, so that reflection of signals specifically does not occur in the data buses (DQ buses), impedance of the signal wires are accurately matched to enable to read and write at a high-speed. In the system operating at a high-speed, a path of a return current is also important, power supply wires on the mother board 107 or the memory modules 103 are also wired so that discontinuity does not occur.

As shown in FIG. 5, each memory module 103 comprises a plurality of memory devices 104 on a module substrate 122. Each memory device 104 are electrically connected to a corresponding wiring on the module substrate 122 through device terminals (DQ pins) 112 and CA pins 113 each of which comprises, for example, a solder ball. The CA pins 113 connect the memory device 104 with intra-module CA buses 111. In the example being illustrated in FIG. 5, two intra-module CA buses 111 are wired in one memory module 103 and each intra-module CA bus 111 supplies a control signal to the memory device 104 through the corresponding CA pins 113, respectively.

Each memory device 104 comprises two DQ pins 112 for every one intra-package DQ bus 114, each DQ pin 112 mutually connects the intra-module DQ bus 110 with the intra-package DQ bus 114. The data bus from the memory controller 101 to the terminating resistor 106 is comprised as a line of wiring without a branch position by the DQ bus 108, the intra-module DQ bus 110, the DQ pin 112, and the intra-package DQ bus 114.

FIG. 3 shows details of the memory device 104 with an equivalent circuit of an input/output portion of a memory chip 120. The memory device 104 comprises the memory chip 120 composed as a date memory portion, a package substrate 121 mounting the memory chip 120 thereon. The memory chip 120 comprises an input driver 128, an output driver 129, an input protection resistor 130, an electrostatic protection capacitor 131, and an internal circuit (not shown) including a memory array. In this figure, wires for the control signals are omitted.

The memory device 104 is pasted to the module substrate 122 through cushioning (elastomer) 132. The package substrate 121 comprises a plurality of wiring layers. On each wiring layer, intra-package power supply planes 118 (VDD) and 119 (GND) wired in a plane fashion and the intra-package DQ bus 114 are wired. The intra-package VDD plane 118 and GND plane 119 are connected to two power supply pins 116 (VDD pins) and 117 (GND pins) through via holes, respectively. The intra-package DQ bus 114 has both ends which are connected to two DQ pins 112 through via holes, respectively. The intra-package DQ bus 114 is wired in the wiring layer between the VDD plane 118 and the GND plane 119.

The memory chip 120 comprises a predetermined number of signal terminal pads 115 which are composed as signal input/output pads. Each signal terminal pad 115 is connected to the corresponding intra-package DQ bus 114 through a via at a predetermined position. The input driver 128 is supplied with a signal from the signal terminal pad 115 through the input protection resistor 130 and sends the signal to the internal circuit of the memory chip 120 by converting a voltage value and so on. The output driver 129 outputs a signal at a predetermined voltage value from the signal terminal pad 115. With this structure, the signal produced by the signal terminal pad 115 may outputs from two DQ pins 112 through the intra-package DQ bus 114. An output MOS transistor of the output driver 129 has a function as an electrostatic protection element and a parasitic capacitor (electrostatic protection capacitor) 131 of the MOS transistor protects the internal circuit of the memory chip 120 from a electrostatic breaking phenomenon.

Figure 6:
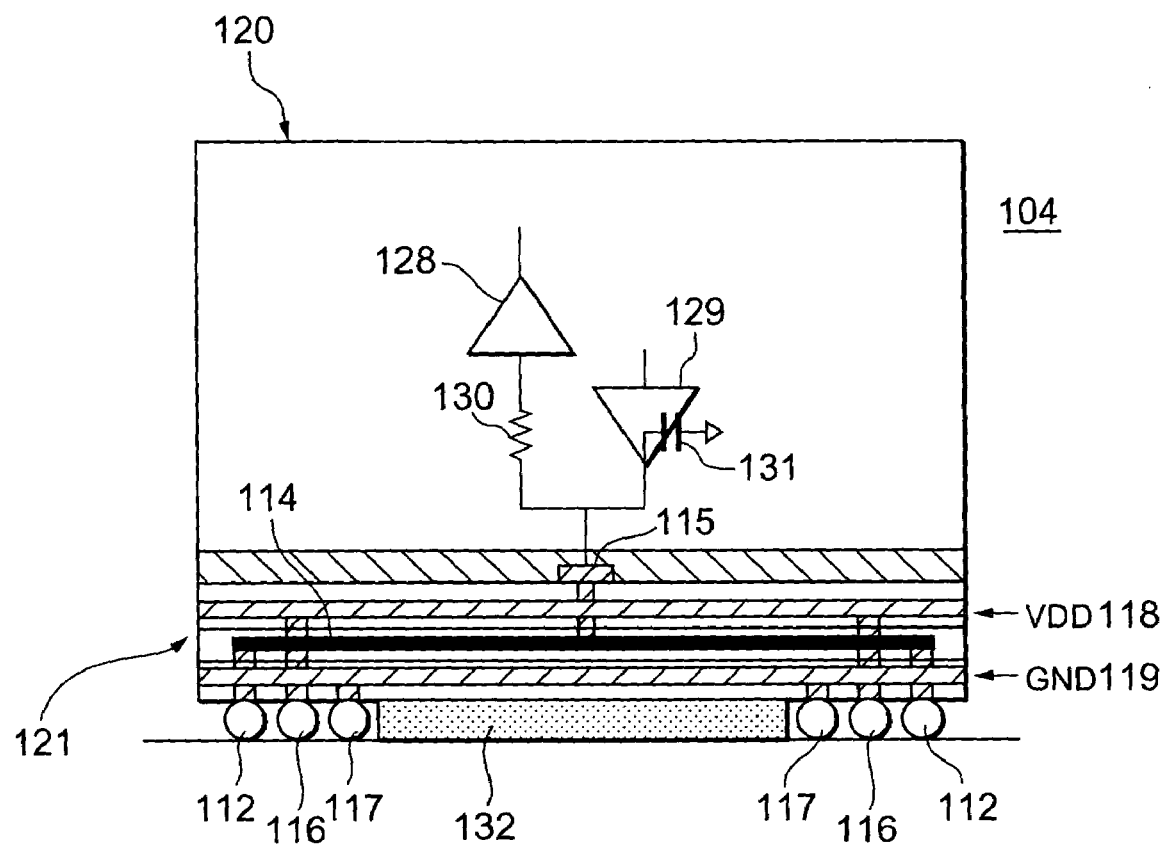
FIG. 6 is a sectional view showing details of a memory device for use in the memory system illustrated in FIG. 4 together with an equivalent circuit of an input/output portion of a memory chip.
Figure 7:
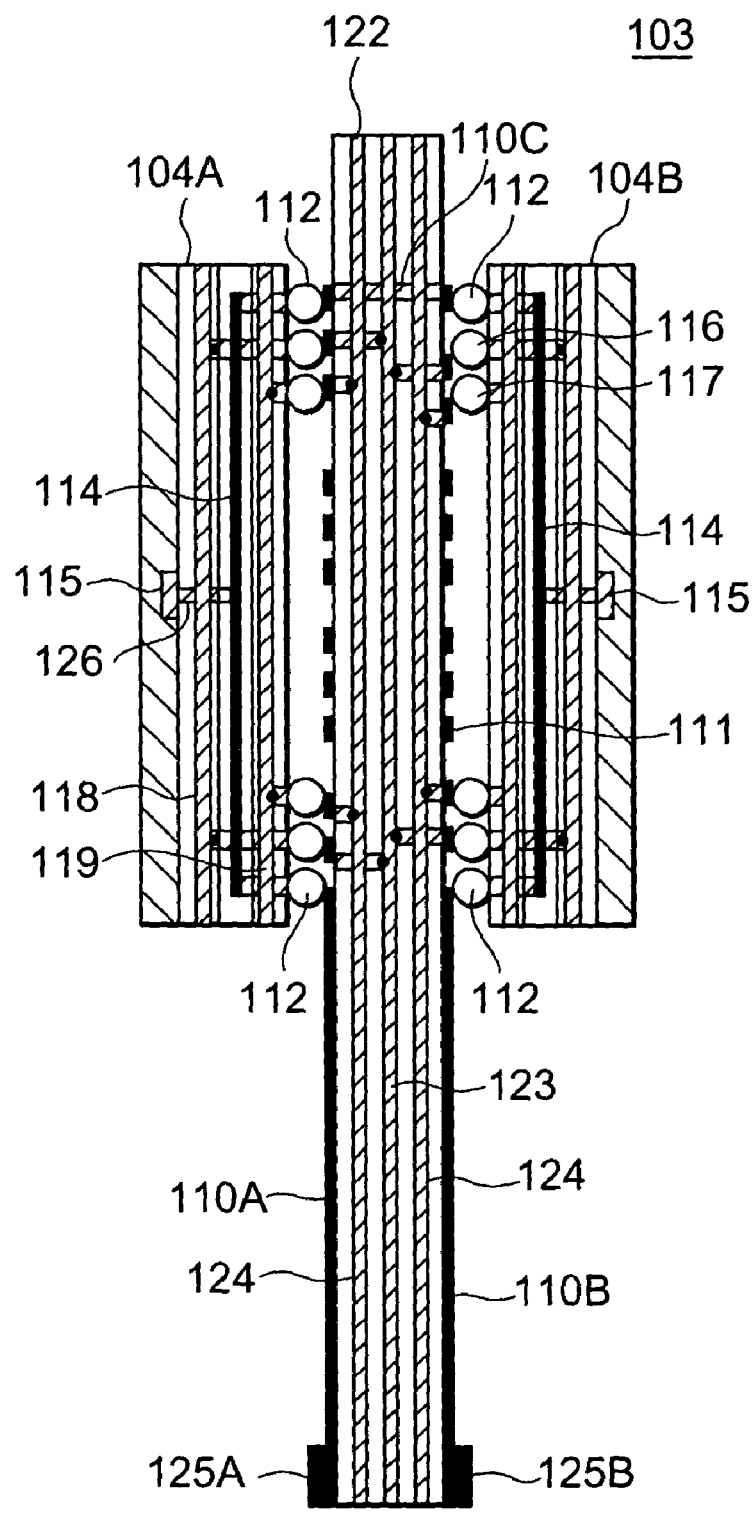
FIG. 7 is a sectional view showing details of a memory module illustrated in FIGS. 4 and 5.

FIG. 7 shows details of the memory module 103 illustrated in FIGS. 4 and 5. The memory module 103 mounts the memory devices 104, 104, each of which is illustrated in FIG. 6, on surfaces of a memory controller side and a terminating resistor side of the module substrate 122. The module substrate 122 has connection terminals 125A and 125B at the memory controller side and the terminating resistor side, respectively. The connection terminal 125A serves as a terminal for connecting an intra-module DQ bus 110A with the DQ bus 108 on the mother board 107 in the module socket 102 (FIG. 4). The connection terminal 125B serves as a terminal for connecting an intra-module DQ bus 110B with the DQ bus 108 on the mother board 107 in the module socket 102 (FIG. 4).

The module substrate 122 comprises wiring layers in which power supply (the intra-module VDD surface 123 and the intra-module GND surfaces 124) are wired therein. The intra-module VDD surface 123 is connected to the intra-package VDD surface 118 through the VDD pin 116 of the memory device 104 and a via hole. The intra-module GND surface 124 is connected to the intra-package GND surface 119 through the GND pin 117 of the memory device 104 and a via hole. In the wiring layers in the module substrate 122, the intra-module GND surfaces 124 are wired at a side of the substrate surface and the intra-module VDD surface 123 is wired between the intra-module GND surface 124. That is, the intra-module VDD surface 123 is comprised as a wire sandwiched between two intra-module GND surfaces 124. The VDD pin 116 and the GND pin 117 of the memory device 104 are disposed adjacent to the DQ pin 112.

On a surface of the module substrate 122, the intra-module DQ buses 110A, 110B and the CA bus 111 are wired. The intra-module DQ buses 110A and 110B are connected to the intra-package DQ buses 114 through the DQ pins 112 and via holes, respectively. An intra-module DQ bus 110 running through the wiring layers comprises a via hole for connecting the DQ pin 112 at a side of the memory controller of the module substrate 112 with the DQ pin 112 at a side of the terminating resistor. In the memory module 103, the data bus comprises as a line of wires consisting of the intra-module DQ buses 110A, 110B, 110C and the intra-package DQ bus 114 of each memory device 104.

In the memory device 204 of the conventional memory system 200 illustrated in FIG. 1, the intra-package wire 213 illustrated FIG. 2 comprises the branch wire for the intra-module wire 208. In the embodiment of this invention, inasmuch as two DQ pins 112 are comprised for one intra-package DQ bus 114, the data bas can comprise the above-mentioned line of wires. The intra-package DQ bus 114, which corresponds to the intra-package wiring 213 in the conventional memory device 204 (FIG. 2), comprises a part of the data bus in the memory system 100 and does not comprise the branch wiring for the data bus.

In the memory system 100 illustrated FIGS. 4 and 5, on writing of data, a signal produced by the memory controller 101 propagates through the DQ bus 108 on the mother board 107 and reaches the connection terminal 125A (FIG. 7) of the memory controller side of the memory module 103 through the module socket 102. In the memory module 103, the signal is supplied from the intra-module DQ bus 110A of the memory controller side connected to the connection terminal 125A to the memory device 104A through one DQ pin 112.

Supplied from one DQ pin 112 of the memory device 104A, a signal propagates the intra-package DQ bus 114, branches to the signal terminal pad 115 through the branch wiring (via hole) 126, and produces from another DQ pin 122. Produced by the other DQ pin 112, a signal is supplied to the memory device 104B of the terminating resistor side through the intra-module DQ bus 110C running through the module substrate 122 and one DP pin 112.

Supplied from one DP pin 112 of the memory device 104B, a signal propagates the intra-package DQ bus 114, branches to the signal terminal pad 115 through the branch wiring 126, and produces from the DQ pin 122. That is, in the memory devices 104A and 104B, the same signal is supplied to both signal terminal pads 115. Produced by the other DQ pin 112, a signal reaches the connection terminal 125B of the terminating resistor side through the intra-module DQ bus 110B of the terminating resistor side.

In the memory system 100, inasmuch as impedance of a signal wire in each component of the mother board 107, the module socket 102, the memory module 103, and the memory device 104, specifically, wiring impedance of the signal wire composing the data bus matches and the data bus has branch-less structure except for the branch wire 126 for the memory chip 120, the influence of the generated signal reflection is small so as to neglect in any place. The signal produced by the memory controller 101 finally reaches the terminating resistor 106 on the mother board 107 through the DQ bus 108 and several memory modules 103 and is terminated by the terminating resistor 106 (FIG. 5).

On the other hand, on reading operation of data, a data signal is produced from a side of the memory device 104 toward the memory controller 101. Produced from an output circuit (not shown) of the memory chip 120 through the signal terminal pad 115, a signal reaches the intra-package DQ bus 114 through the branch wire 126. From the memory device 104, the data signal is produced toward the memory controller 101 through one DQ pin 112 and the data signal is produced from other DQ pin 112 toward the terminating resistor 106.

Produced toward the memory controller, the data signal reaches the memory controller 101 through the DQ bus 108 and signal wires in the memory module 103. Inasmuch as the impedance of the data bus matches in the DQ bus 108 and the memory module 103 and the DQ bus 108 and the memory module 103 are composed so that time required where the data signal goes and returns the branch wire 126 is sufficiently short compared with the rising time of the data signal, the data signal propagates without a large distortion of the waveform and is terminated by the terminating resistor (not shown) of the memory controller side. Produced toward the terminating resistor 106, the data signal propagates the impedance matched data bus without reflection and is terminated by the terminating resistor 106 in a similar manner on the above-mentioned writing operation.

In this embodiment, two device terminals (DQ pins 112) are provided for every one intra-package DQ bus 114. In the memory device 104, the intra-package DQ bus 114 is connected to the signal terminal pad 115 on the memory chip 120 between two DQ pins 112 through the branch wire 126. Therefore, it is possible to comprise the intra-package DQ bus 114 of the memory device 104 as a part in the data bus from the memory controller 101 to the terminating resistor 106 without comprising as the branch wiring for the data bus. That is, it is possible for the memory system 100 to make the signal wiring for a signal structure of the line of wires with the impedance matching. In the memory system 100, reflection of the signal generated by the data bus is lowered, it is possible to propagate a data signal with high quality, and the memory system 100 can operate at a high speed compared with prior art.

In addition, each wiring in the data bus is shielded by the power supply surface (the VDD surface, the GND surface). It is therefore possible to intercept cross-talk noises which invades from the signal wires to the memory chip 120. Inasmuch as the package substrate 121 is provided with the intra-package VDD surface 118 and the intra-package GND surface 119, the intra-module wiring 114 comprises a strip line, and a rate of metal (copper) occupying the package substrate 121 is high, radiation of heat is smoothly carried out. It is therefore possible to prevent degradation of performance caused by rising of temperature of the memory chip 120.

Inasmuch as a part of the data bus is wired as the intra-package DQ bus 114 in the memory device 104 in the memory system 100, it is unnecessary to wire the data bus (the intra-module DQ bus 108) in the memory module 103 directly under the memory device 104. Although the memory device 104 comprises the DQ pins 112 disposed at the ends thereof and the CA pin 113 disposed at the center portion illustrated in FIG. 5, inasmuch as the part of data bus passes through the memory device 104, the intra-module wiring 108 breaks at this place and does not cross the CA bus 111 on the module substrate 122.

In the conventional memory system 200, it is necessary to wire the DQ bus 112 and the CA bus 113 in different wiring layers in a case where the DQ bus 112 and the CA bus 113 cross each other. Inasmuch as the data bus passes through the intra-package DQ bus 114 in the embodiment of this invention, it is easy to cross the CA bus 111 which is wired in a longitudinal direction (right and left) on the memory module as shown in FIG. 4, it is unnecessary to increase the wiring layers, degree of freedom of the wiring layout increases. It is therefore possible to assign a large wiring occupied area to the CA bus 111 and it is possible to decrease signal timing error, signal reflection, and cross-talk noises which are generated by the CA bus 111.

Figure 8:
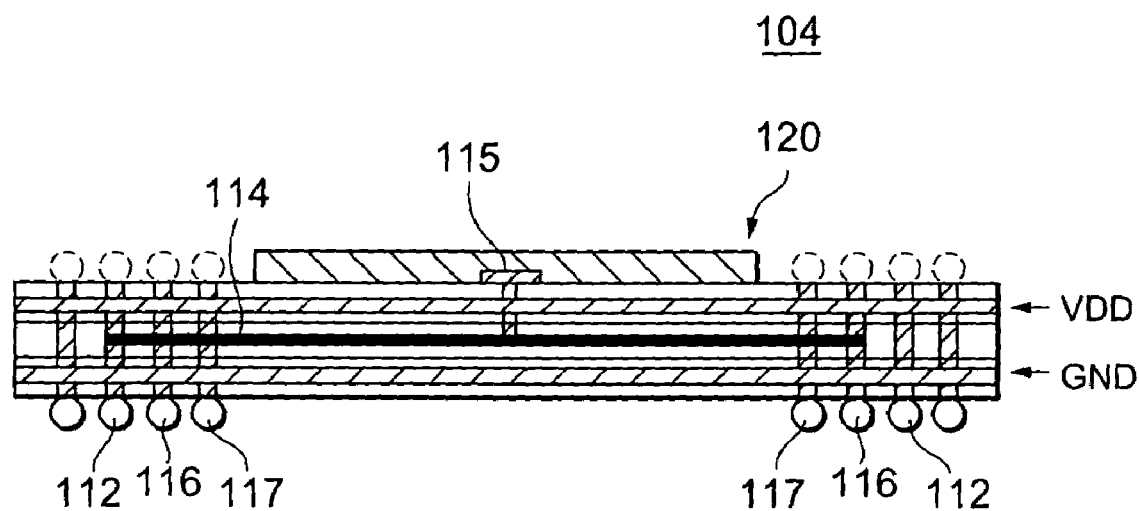
FIG. 8 is a sectional view showing details of a memory device for use in a memory system according to a second embodiment of this invention.

FIG. 8 shows details of the memory device 104 for use in a memory system according to a second embodiment of this invention. The memory device 104 of this embodiment comprises the memory chip 120 and the package substrate 121 having a size larger than that of the memory chip 120. The package substrate 121 has structure where contacts enable to pick out from a surface opposite to the device terminals such as the DQ pins 112, the power supply pins 116, 117. If the memory devices 104 illustrated in FIG. 8 are piled up to two-stage, a second stage of device terminals are connected to the contacts formed on a first stage of the memory device 104, and it is possible to easily obtain a layered structure.

Figure 9:
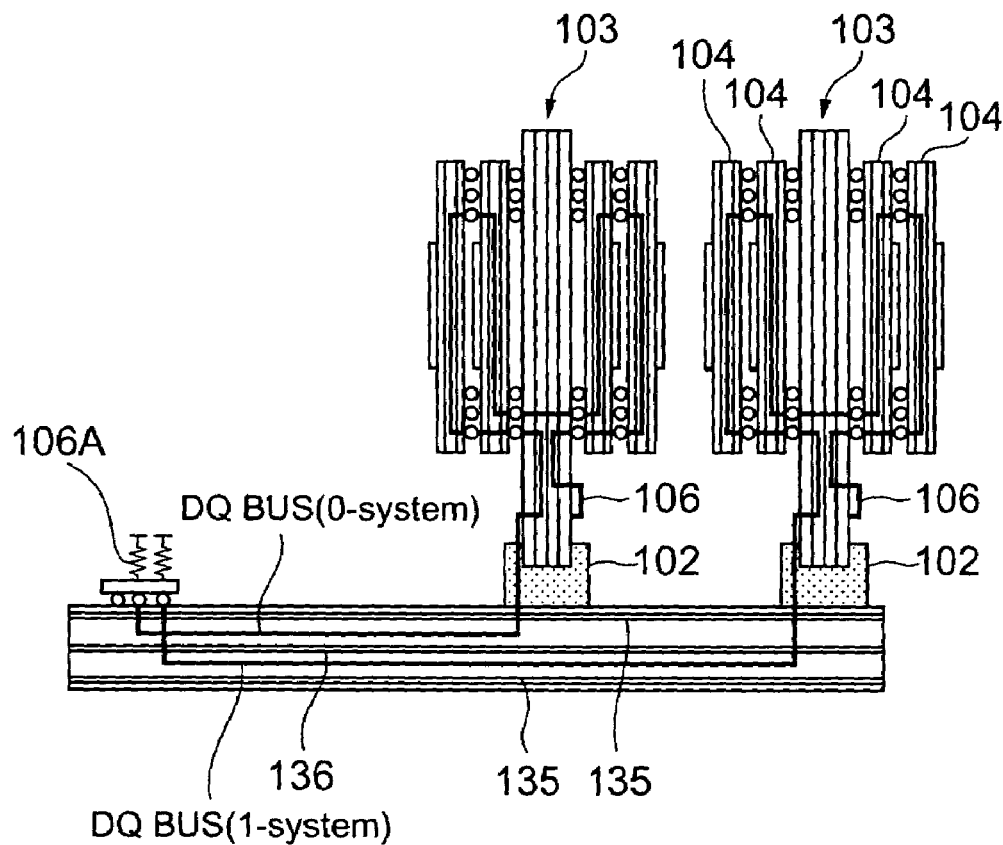
FIG. 9 is a sectional view showing a structure of the memory system according to the second embodiment of this invention.

FIG. 9 shows structure of the memory system according to the second embodiment of this invention. The memory system 100 according to the second embodiment is different from that according to the first embodiment in a point where the memory system comprises dual-system of data bus terminated in one memory module 103 and in a point where one memory module 103 mounts a plurality of laminated memory devices 104 thereon. In FIG. 9, illustration of connection between power supply surfaces (the VDD surface 123 and the GND surfaces 124) in the module and power supply surfaces (the VDD surface 118 and the GND surfaces 119) in the package is not omitted.

The dual-system of the data bus is wired. The dual-system of the data bus is called 0-system and 1-system. Each system of the data bus has one terminal terminated by an on-chip termination (on-chip terminating resistor) disposed in the memory controller 101 and another end terminated by the terminating resistor 106 disposed in the memory module 103. Each DQ bus 108 composing the data bus is wired with the DQ bus 108 sandwiched by layers in which the power supply surfaces (VDD or GND) 135, 136 for supplying a power supply to each element of the memory system 100 are wired.

Figure 10:
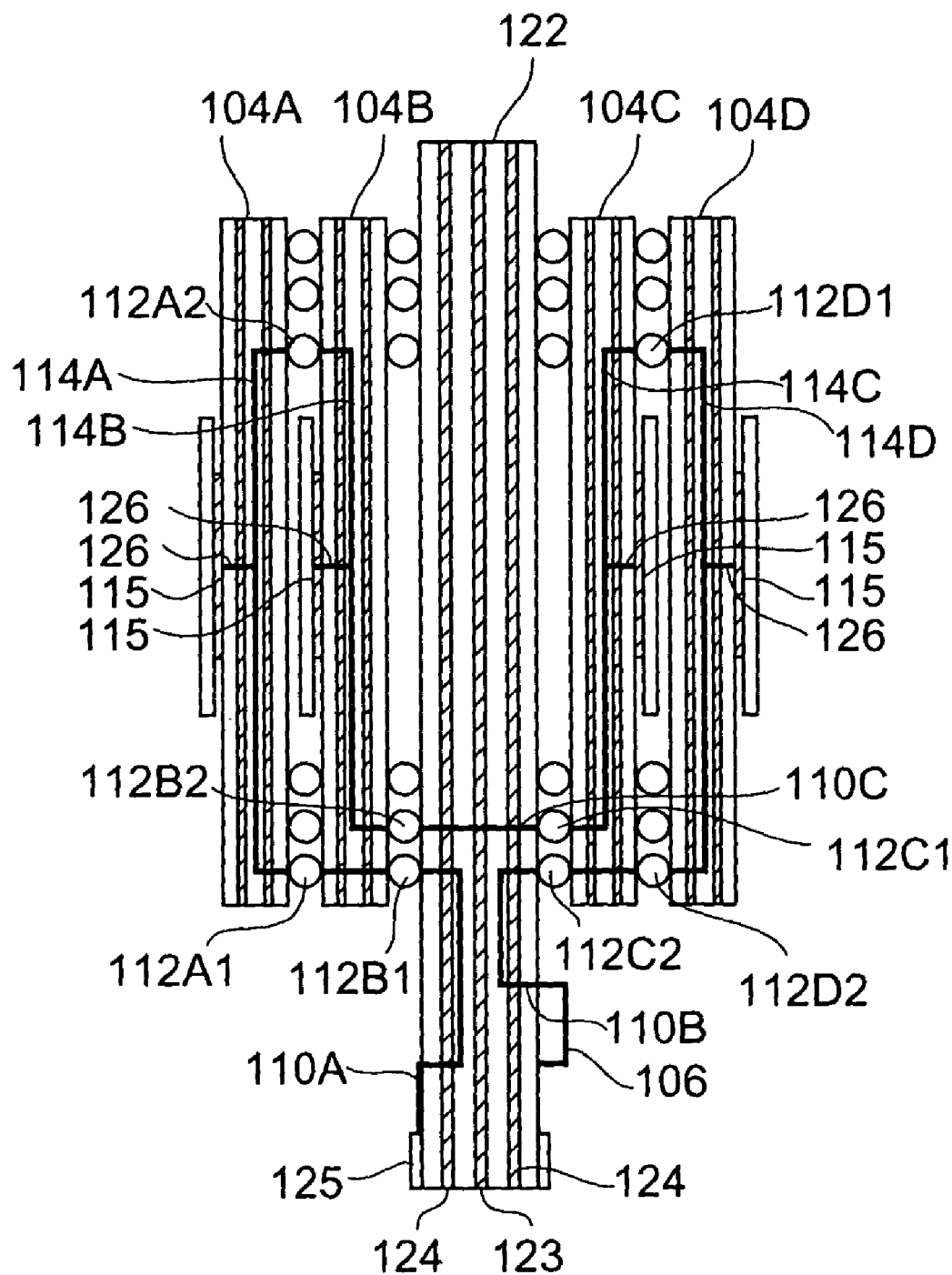
FIG. 10 is a sectional view showing details of a memory system for use in the memory system illustrated in FIG. 9.

FIG. 10 shows details of the memory module 103 illustrated in FIG. 9. The memory module 103 has one side where two memory devices 104 are laminated. That is, the memory module 103 comprises four memory devices 104 in total. In the example being illustrated, the four memory devices 104 are called first through fourth memory devices 104A, 104B, 104C, and 104D in order to distinguish them. Each of intra-module DQ buses 110A and 110B has a part which is wired in a wiring layer intermediating between the intra-module VDD surface 123 and the intra-module GND surface 124. In each memory device 104, the intra-package DQ bus 114 and the signal terminal pad 115 are connected to each other through the branch wire (via hole) 126. The data bus extending from the connection terminal 125 to the terminating resistor 106 is comprised as a line of wires in the manner which will presently be described.

The connection terminal 125 is connected to a first DQ pin 112B1 of the second memory device 104B through the intra-module DQ bus 110A of the memory controller side. The DQ pin 112B1 is connected to a first DQ pin 112A1 of the first memory device 104A through a via hole without be connected to the intra-module DQ bus 114B. The DQ pin 112A1 is connected to one end of a first intra-module DQ bus 114 through a via hole.

A second DQ pin 112A2 of the first memory device 104A is connected to another end of the first intra-module DQ bus 112A and is connected to one end of a second intra-module DQ bus 114B. The second intra-module DQ bus 114B has another end connected to a second DQ pin 112B2 of the second memory device 104B through a via hole. The DQ pin 112B2 is connected to a first DQ pin 112C1 of the third memory device 102C through a DQ bus 110C which comprises a via hole and which runs through the module substrate 122.

The first DQ pin 112C1 is connected to one end of a third intra-module DQ bus 114C in the third memory device 104C. The third intra-module DQ bus 114C has another end connected to a first DQ pin 112D1 of the fourth memory device 104D. The first DQ pin 112D is connected to one end of a fourth intra-module DQ bun 114D in the fourth memory device 104D. The fourth intra-module DQ bus 114D has another end connected to a second DQ pin 112D2 of the fourth memory device 104D. The second DP pin 112D2 is connected to a second DQ pin 112C2 of the third memory device 104C. The second DQ pin 112C2 is connected to the intra-module DQ bus 110B of the terminating resistor side. The intra-module DQ bus 110B is terminated by the terminating resistor 106 mounted on the module.

It will be assumed that data for the 0-system is written in the memory system 100 illustrated in FIG. 9. In this event, a signal produced by the memory controller 101 propagates the DQ bus 108 on the mother board 107 and reaches the connection terminal 125 (FIG. 10) of the memory module 103 through the module socket 102.

The signal reaching the memory module 103 propagates the DQ pins 112 in order of 112B1, 112A1, 12A2, 112B2, 112C1, 112D1, 112D2, and 112C2 through the DQ buses 110, 114 and via holes and is terminated by the terminating resistor 106. Produced by the memory controller 101 the signal reaches the terminating resistor 106 without branching except for the branch wirings 126 for being connected to the signal terminal pads 115 and is terminated on the memory module 103. A count where the signal passes though the module socket 102 is one.

Inasmuch as the data bus extending from the memory controller 101 to the terminating resistor 106 is comprised as a line of wires without branching in the second embodiment in the manner as the first embodiment, reflection of the data signal is lowered and it is possible to make the signal transmit with high quality. Inasmuch as a plurality of memory devices 104 are laminated on one memory module 103, it is possible to realize a memory having a large capacity with a small area.

The memory system according to the second embodiment adopts a structure where the signal passes through the module socket 102 only one time for one system of data bus. It is possible for the module socket 102 to take impedance matching to some extent by adding a capacitor. However, it may not be easy for the connector portion of the module socket 102 to arrange the power supply lines (VDD lines or GND lines) at suitable positions for the data bus. When it is impossible to suitably arrange the power supply lines, it is difficult to constitute an ideal data bus and a characteristic of signal transmission degrades. By decreasing the count where one system of data bus passes through the module socket 102, the characteristic of the signal transmission is improved.

Figure 11:
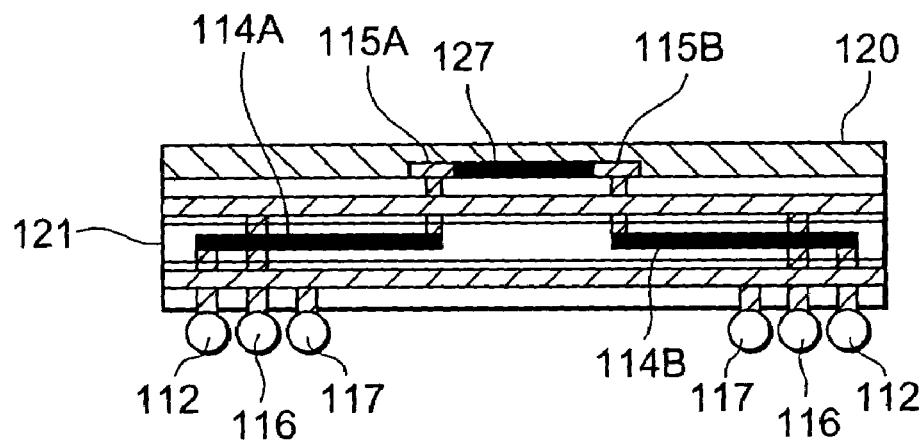
FIG. 11 is a sectional view showing details of a memory device for use in a memory system according to a third embodiment of this invention.

FIG. 11 shows details of a memory device for use in a memory system according to a third embodiment of this invention. Although the signal terminal pad of the memory chip 120 is comprised as the input/output pad in the first and the second embodiments of this invention, the signal terminal pad is separated into a signal input terminal pad 115A for inputting a signal and a signal output terminal pad 115B for outputting a signal in the third embodiment of this invention.

The memory device 104 shown in FIG. 6 adopts a structure where the data bus extending from one DQ pin 112 to another DQ pin 112 has a branch at a position where the branch wire 126 for connecting to the signal terminal pad 115 is wired. In lieu of this, this embodiment adopts a structure where the data bus extending from one DQ pin 112 to another DQ pin 112 has no branch. Specifically, as shown in FIG. 11, the signal input terminal pad 115A and the signal output terminal pad 115B are connected through an intra-chip DQ bus 127 and the intra-package DQ bus 114 is divided into a first intra-package DQ bus 114A for connecting one DQ pin 112 with the signal input terminal pad 115A and a second intra-package DQ bus 114B for connecting another DQ pin 112 with the signal output terminal pad 115B.

Figure 12:
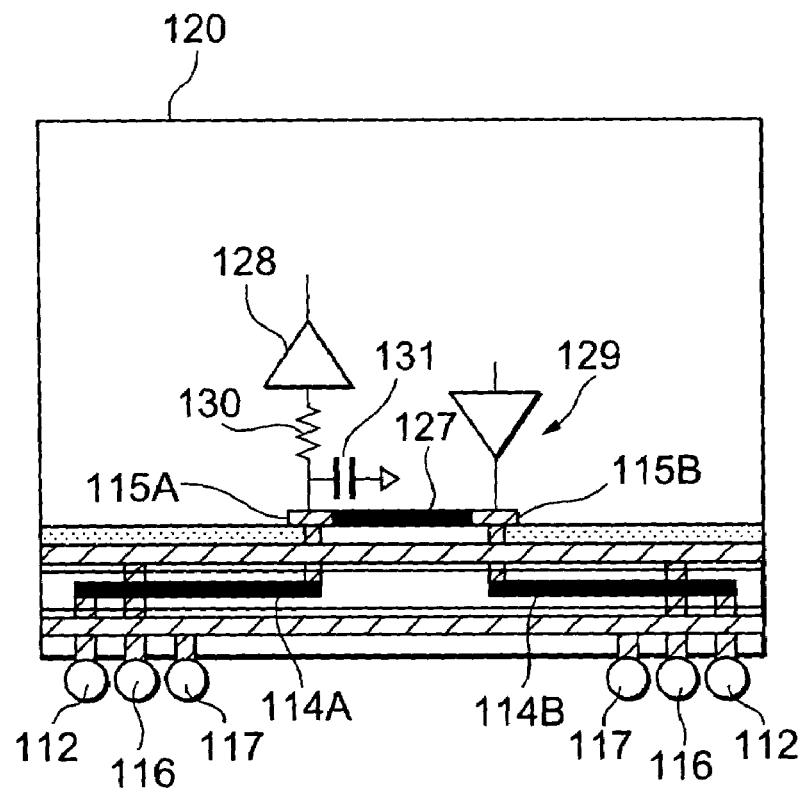
FIG. 12 is a sectional view showing the memory device illustrated in FIG. 11 together with an equivalent circuit of an input/output portion of a memory chip.

FIG. 12 shows the memory device 104 illustrated in FIG. 11 with an equivalent circuit of an input/output portion of the memory chip 120. The memory chip 120 comprises, at the input/output portion, an input driver 128, an output driver 129, an input protection resistor 130, and an electrostatic protection capacitor 131.

The input driver 128 is supplied with a signal through the input protection resistor 130 from the signal input terminal pad 115A, converts a voltage value of the signal into a converted signal, and produces the converted signal to an internal circuit of the memory chip 120. The output driver 129 produces a signal with a predetermined voltage value from the signal output terminal pad 115B. The output driver 129 comprises an output MOS transistor (not shown) serving as an electrostatic protection element. An MOS transistor has a parasitic capacitor (the electrostatic protection capacitor) protects the internal circuit of the memory chip 120 from an electrostatic destruction phenomenon.

Attention will be directed to a case of inputting a signal to the signal input terminal pad 115A. Supplied from one DP pin 112, a signal reaches the signal input terminal pad 115A either through the first intra-module DQ bus 114A and via holes or through the second intra-module DQ bus 114B, the signal output terminal pad 115B, the intra-chip DQ pad 127, and via holes. The signal reaching the signal input terminal pad 115A reaches another DQ pin 112 either through the intra-chip DQ bus 127, the signal output terminal pad 115B, the second intra-module DQ bus 114B, and via holes or through the first intra-module DQ bus 114A and via holes and is outputted to the outside of the memory device 104. In this event, there is no branch position in a signal path within the package substrate 121 extending from one DQ pin 112 to another DQ pin 112.

Attention will be directed to a case where the memory chip 120 produces a signal. Produced by the signal output terminal pad 115B, a signal is produced to the outside of the memory device 104 through the intra-chip DQ bus 127, the signal input terminal pad 115A, the first intra-module DQ bus 114A, via holes, and another DQ pin 112 and is produced to the outside of the memory device 104 through the second intra-module DQ bus 114B, via holes, and another DQ pin 112.

In the third embodiment of this invention, the signal input terminal pad 115A for inputting the signal for the memory chip 120 and the signal output terminal pad 115B for outputting the signal are comprised as different pads. In this event, it is possible for the package substrate 121 to constitute a line of wires with no branch from one DQ pin 112 to another DP pin 112 of the memory device 104 and a signal transmission characteristic is further improved.

Although the memory device 104 adopts a structure where the package substrate 121 having wiring layers is put on the memory chip 120 in the above-mentioned embodiment, it may use a tape material having a layered structure in place of the package substrate 121. Although impedance of each wire in the package substrate 121 may be adjusted a thickness of the wire, a width of the wire, an interval between wires, material of the wiring layer or an insulating layer, a structure of the wire, or the like, it may be adjusted by adding a capacitance element in the vicinity of the signal terminal pad 114 on the memory chip 120.

Figure 13:
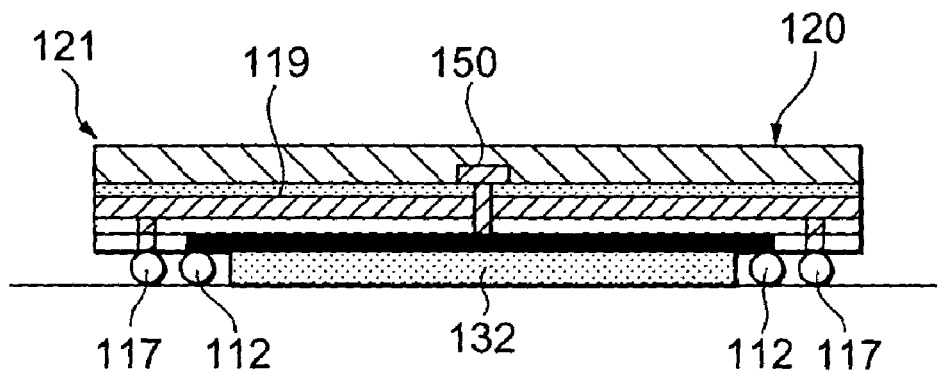
FIG. 13 is a sectional view showing details of a different example of a memory device for use in a memory system.

FIG. 13 shows details of another example of the memory device 104. Although the intra-package DQ bus 114 is wired with it sandwiched between the intra-package VDD surface 118 and the intra-package GND surface 119 in the above-mentioned embodiments, the memory device 102 illustrated in FIG. 13 has a structure where the intra-package VDD surface 118 or the intra-package GND surface 119 is wired in a wiring layer of the memory chip side and the intra-package DQ bus 114 is wired in a wiring layer lower than the wiring layer of the memory chip side. Although the input driver is directly connected to the signal input terminal pad 115A and the output driver is directly connected to the signal output terminal pad 115B in the third embodiment of this invention, the input driver and the output driver may be disposed between two signal terminal pads connected to the intra-chip wire.

Figure 14A:
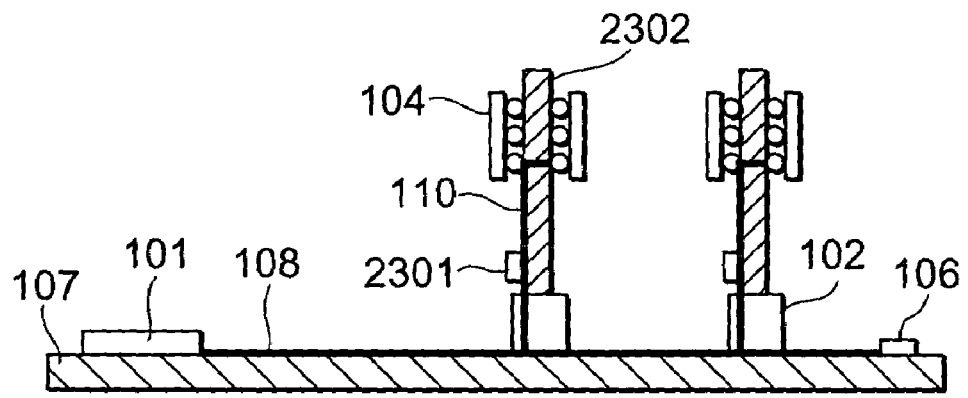
FIGS. 14A and 14B are sectional view showing signal wiring paths in conventional different memory systems.
Figure 14B:
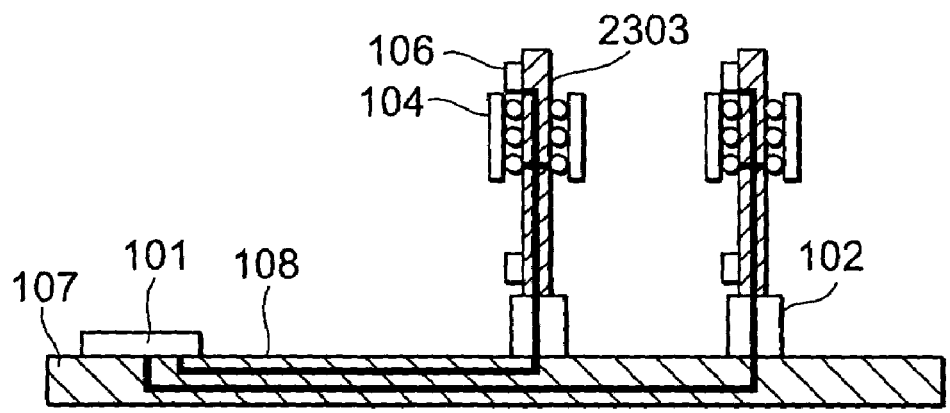

FIGS. 14A and 14B show examples of an input/output signal bus in the memory system. FIG. 14A shows an example of an SSTL bus while FIG. 14B shows an example of a one-to-one connection bus. The SSTL bus shown in FIG. 14A is equivalent to that shown in FIG. 3.

In the SSTL bus, on connecting a branch wire 110 on a memory module with a main wire 108 on a mother board, a resistor 2301 is inserted in a branch position of the branch wire. It is desirable that a resistance value Rs of the resistor 2301 is satisfied a relationship of:

$Z_0/2 + Rs = Z_1$, in order to match a characteristic impedance at a branch, where $Z_0$ represents a characteristic impedance of the main wire 108 on the mother board and $Z_1$ represents a characteristic impedance of the branch wire 110 on the memory module 110. However, in order to ensure a signal amplitude on outputting to the memory side, a smaller value than the above by a little may be used as the resistance value Rs.

In this event, reflection is decreased because impedance mismatching between the branch wire and the main wire is eased when a signal reflected at an end of the branch wire turns back to the main wire. Accordingly, it is possible to decrease distortion of waveform due to repetition of the reflection and date transfer of a high-speed can be carried out. The main wire has an end which is terminated to a predetermined end voltage (e.g. a half of a power-supply voltage) through a terminating resistor 106. By setting a value of the terminating resistor in a suitable value, reflection of the signal at the end of the main wire is prevented.

In the manner as described above, in the technique described in EP 0818734 A2, the memory system having branch can carry out the high-speed operation by decreasing distortion of a signal due to repetition of reflection of the signal generated by wiring branch positions because the memory system comprises the resistor (the stub resistor) for matching a characteristic impedance of a transmission line at a branch point of the signal wire.

Figure 15:
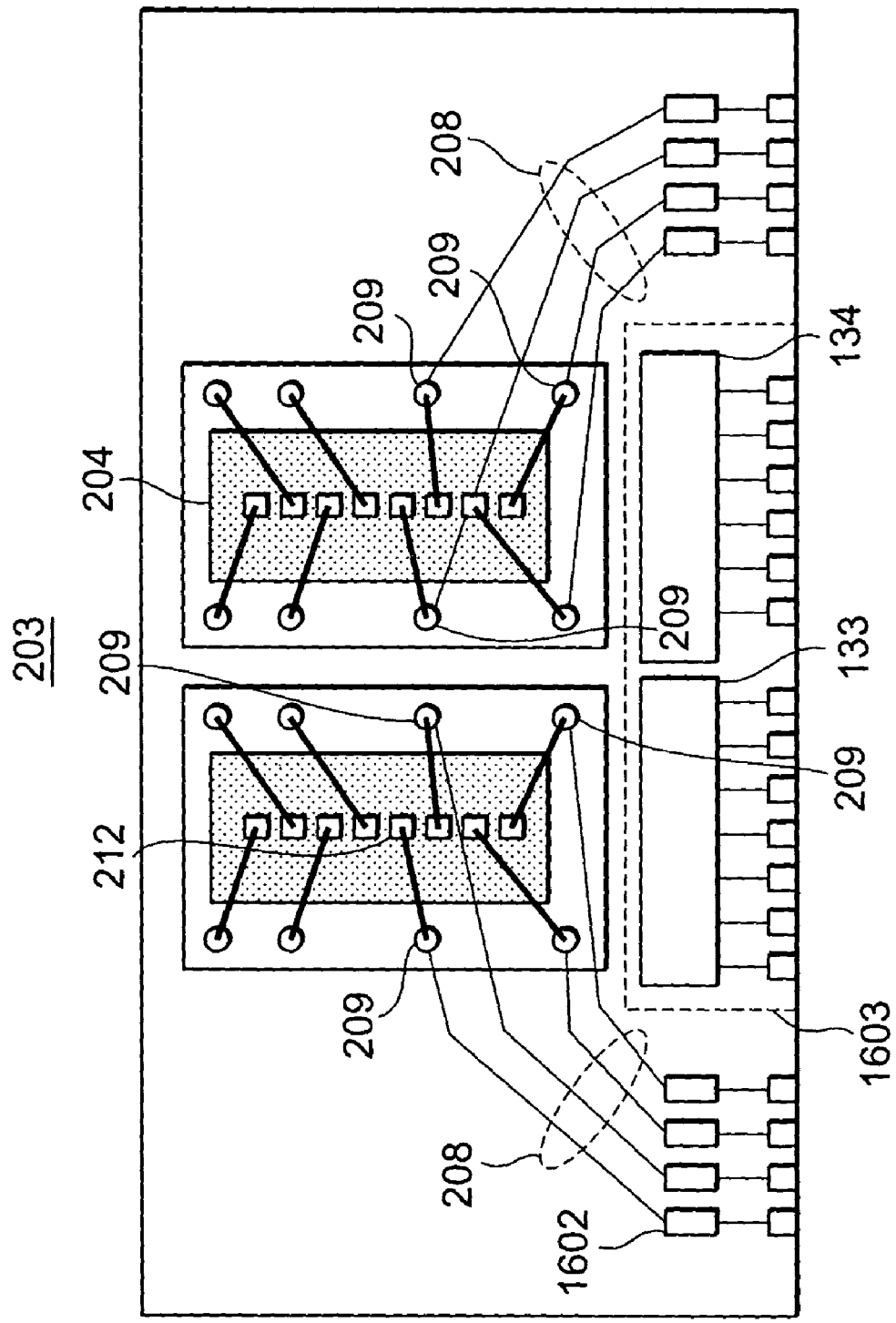
FIG. 15 is a plan view showing a wiring layout of a conventional memory module.
Figure 16:
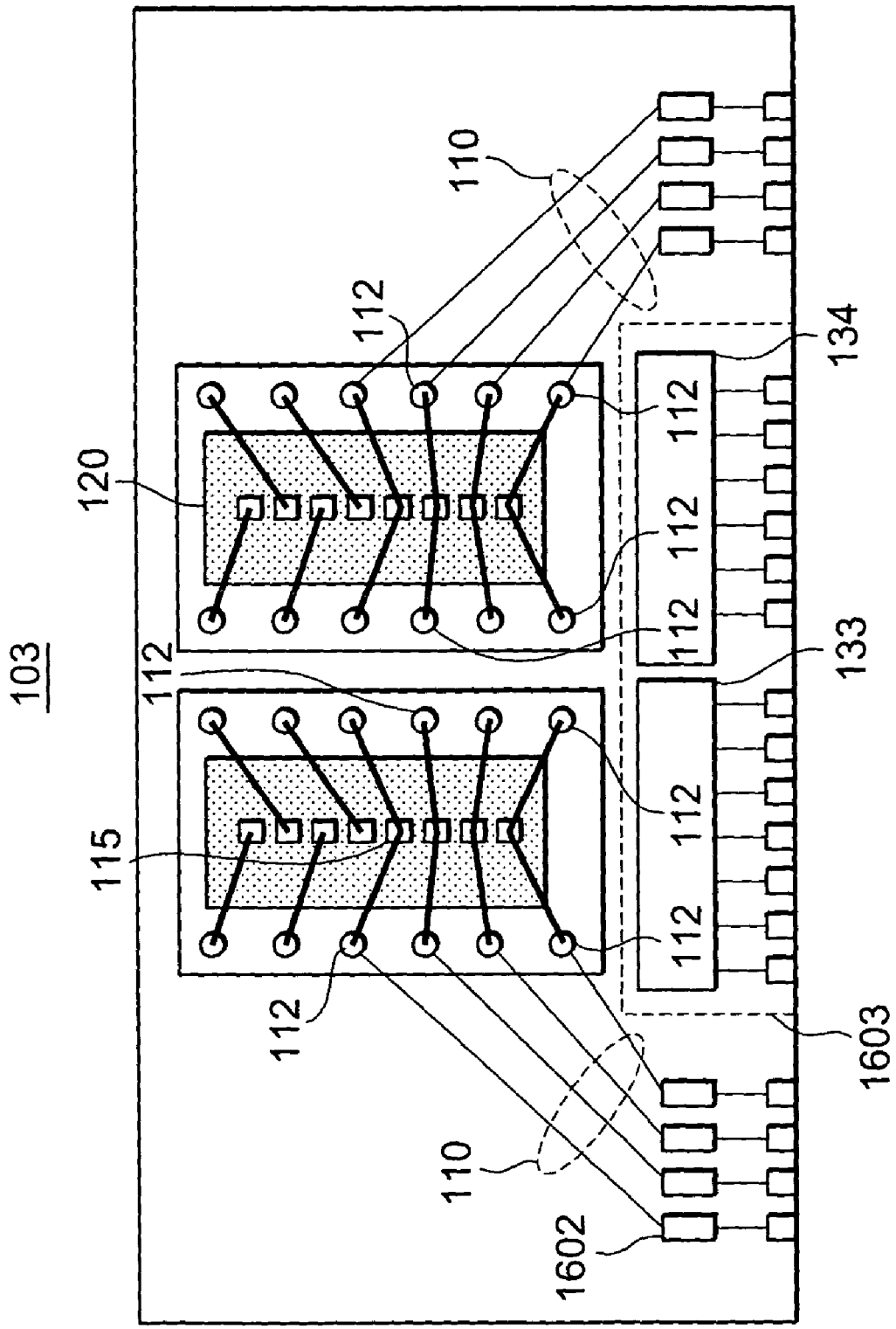
FIG. 16 is a plan view showing a wiring layout of a memory module for use in the memory system illustrated in FIG. 4.

FIG. 15 shows a wiring layout of the conventional memory module 203 for use in a conventional memory module 2302 illustrated in FIG. 14A. FIG. 16 shows a wiring layout of the memory module 103 for use in the memory module 230 for use in the memory module 2303 illustrated in FIG. 14B. As shown in FIG. 15, in the conventional memory module 230, a drawing of wires is complicated because of a restriction of a position relationship of connectors on the module substrate and presence of blocks such as the CA resisters 133 and the PLL circuit 134 disposed on the module substrate and it may be difficult to unify a wiring length of the intra-module DQ buses 208.

Figure 17:
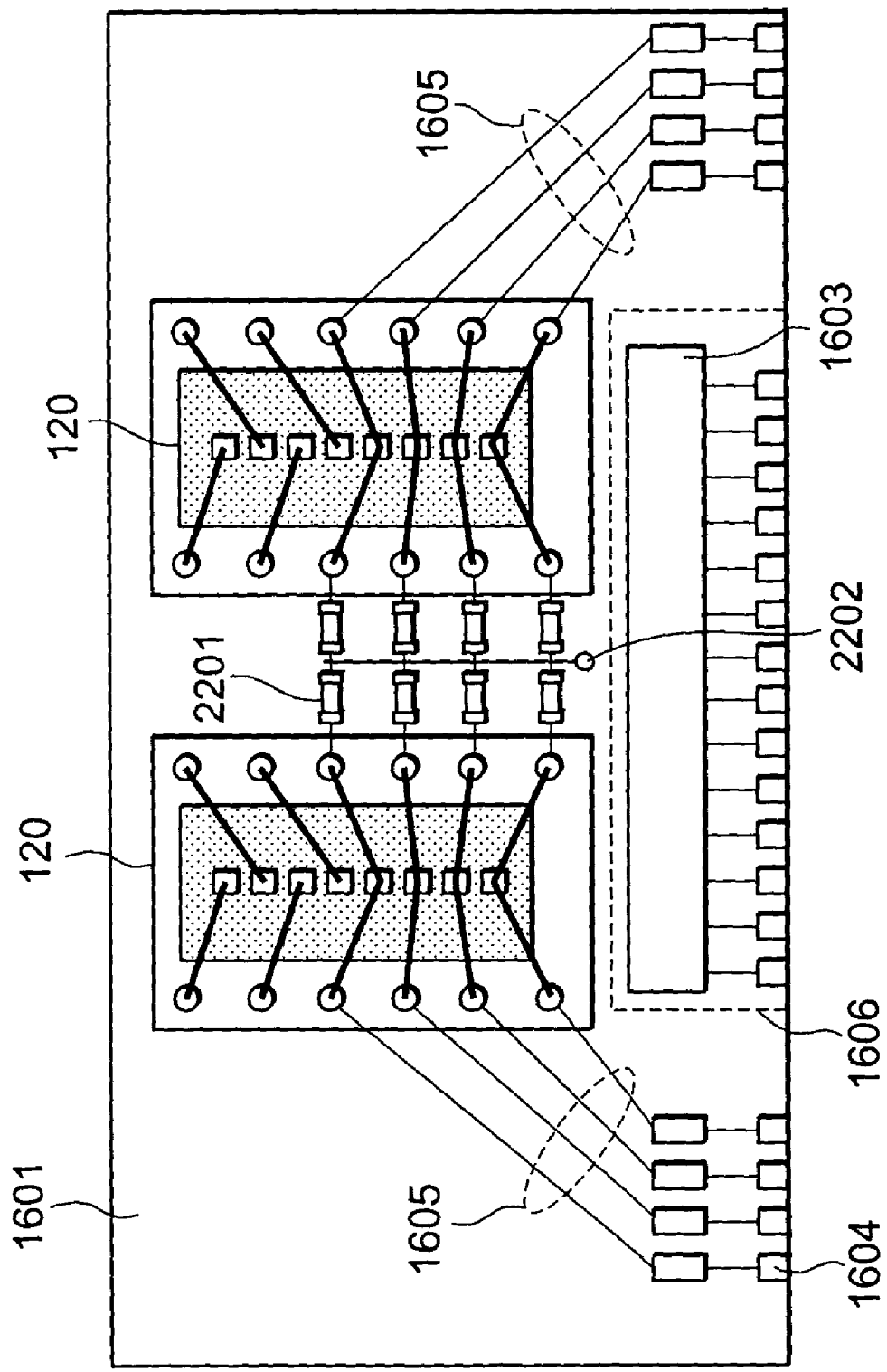
FIG. 17 is a plan view showing an embodiment in a case where the semiconductor unit according to the first and the second aspects of this invention is used in a memory module for use in a one-to-one connection bus.

Inasmuch as two device terminals exist for one signal in this embodiment, it is possible to easily make a suitable wiring layout by using either one in two DQ pins 112 illustrated in FIG. 16 and it is possible to easily unify the wiring length. If a wiring layout of the memory module illustrated in FIG. 17 is adopted to the memory module 2303 illustrated in FIG. 14B, it is possible to easily make a suitable wiring layout, it is possible to easily unify the wiring length, it is possible to construct a line of wires with no branch from one DQ pin 112 to another DQ pin 112 of the memory device, and a good signal transmission characteristic is obtained.

Figure 18B:
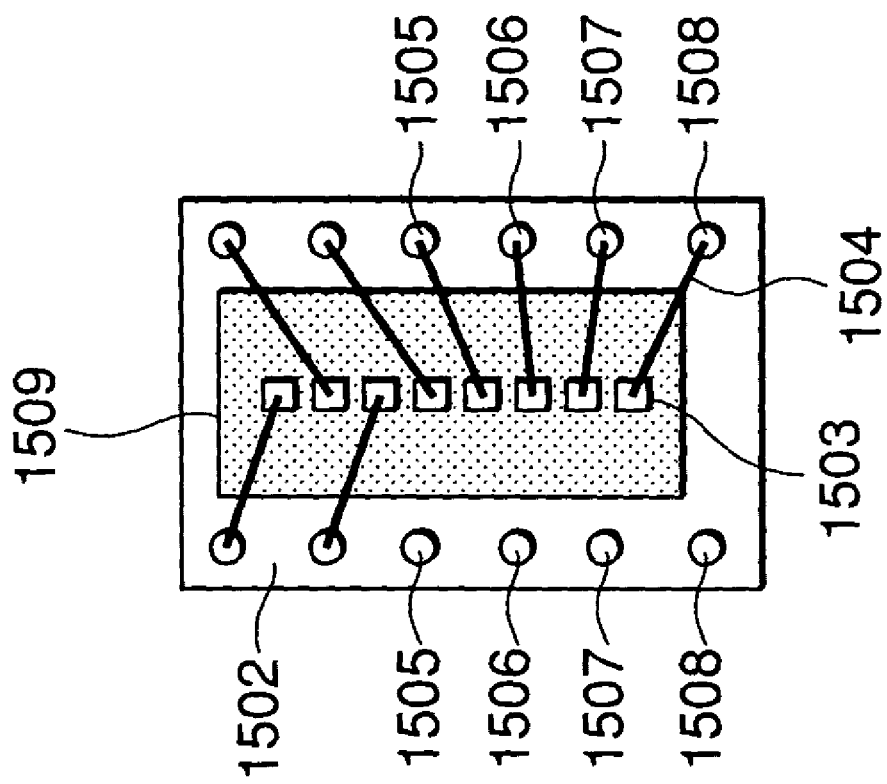
FIGS. 18A and 18B are plan views showing structure of a memory package of a first embodiment of a semiconductor unit according a third aspect of this invention.
Figure 18A:
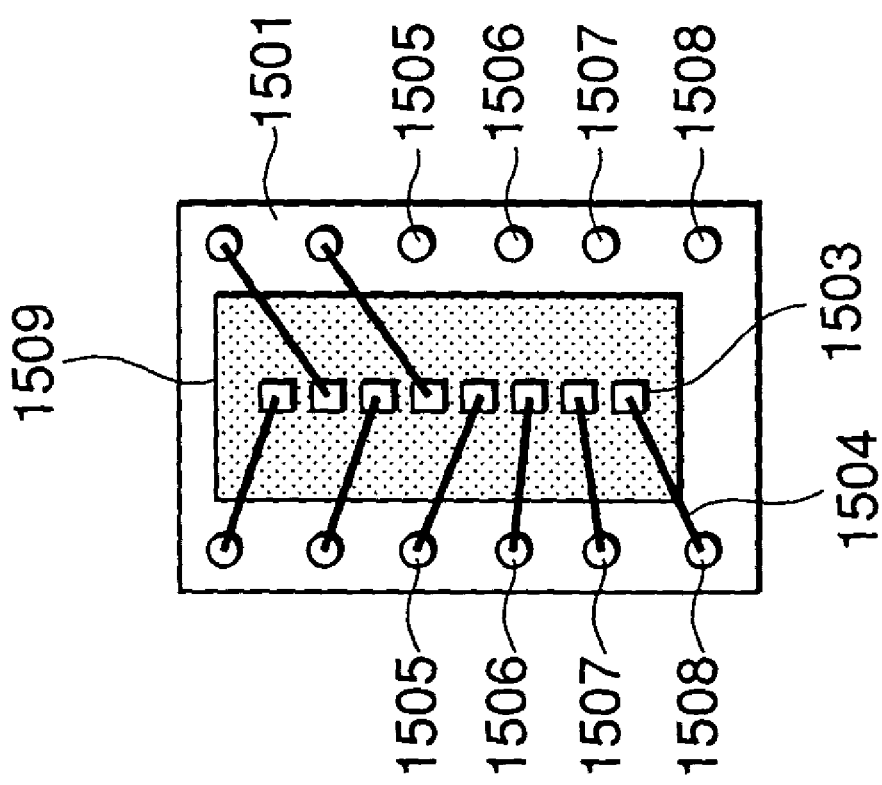

FIGS. 18A and 18B show examples of a memory package according to a third aspect of this invention. There is input/output signal terminals 1505 through 1508 both sides of right and left of the memory package one by one and wires are made from input/output signal chip pads on the chip 1099 to either the input/output signal terminals of right side or the input/output signal terminals of left side. In the example being illustrated, an input/output signal chip pad 1503 is wired to the input/output signal terminal 1508 of the left-side in a package 1501 illustrated in FIG. 18A while the input/output signal chip pad 1503 is wired to the input/output signal terminal 1508 of the right-side in a package 1502 illustrated in FIG. 18B.

Figure 19:
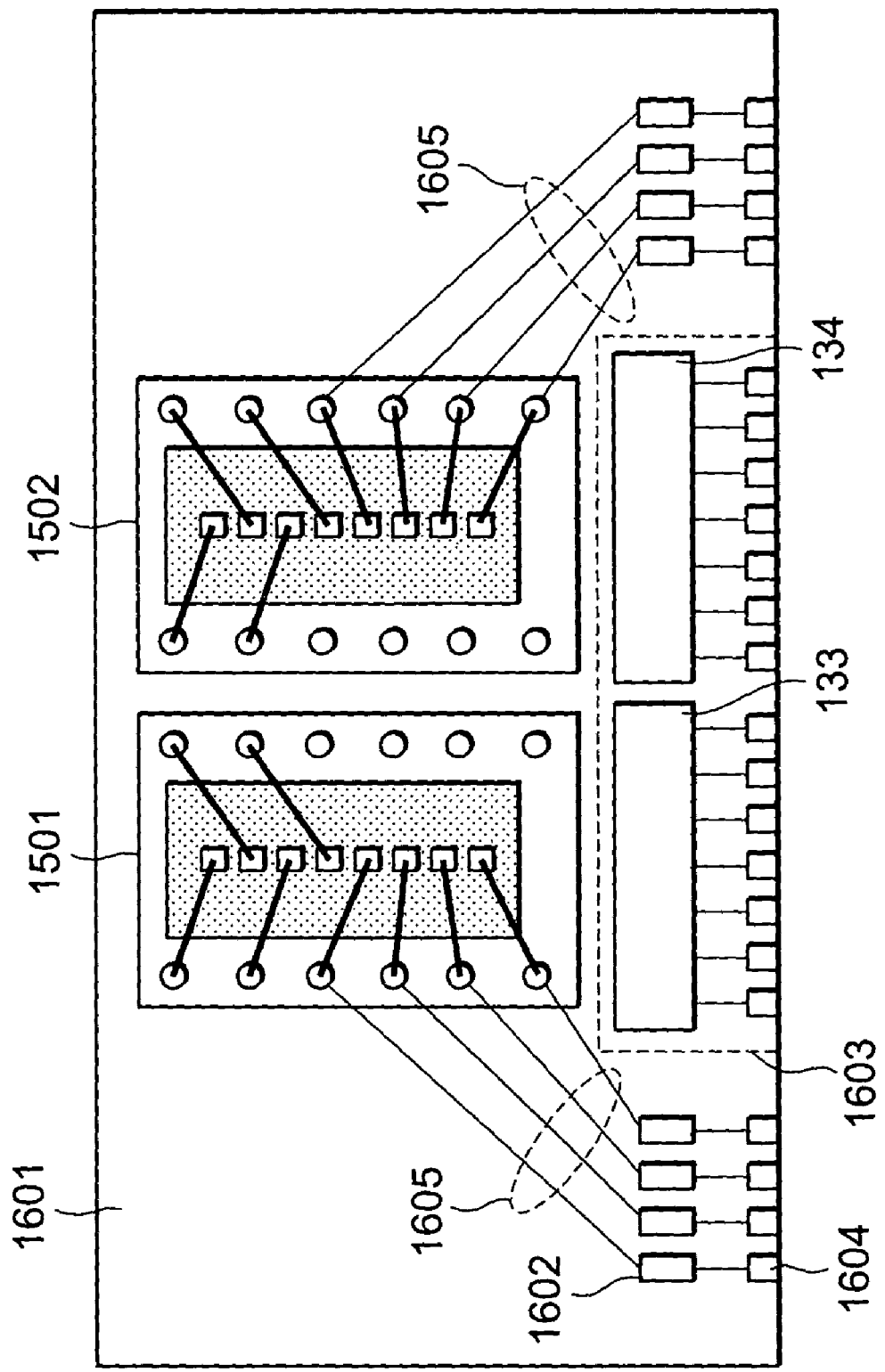
FIG. 19 is a plan view showing structure of a semiconductor module according to a third aspect of this invention.

FIG. 19 shows an example of a memory module using the memory package according to the third aspect of this invention. As shown in FIG. 19, the package 1501 having effective left-hand terminals is used in a case of wiring from left-side of a region 1603 where a wire cannot carry out to a memory while the package 1502 having effective right-hand terminals is used in a case of wiring from right-side of the region 1603 to the memory. By using either one package in two types of the packages 1501 and 1502 in the manner which is described above, it is possible to easily make a suitable wiring layout and it is possible to shortening the wiring length and to easily unify the wiring length.

Figure 20:
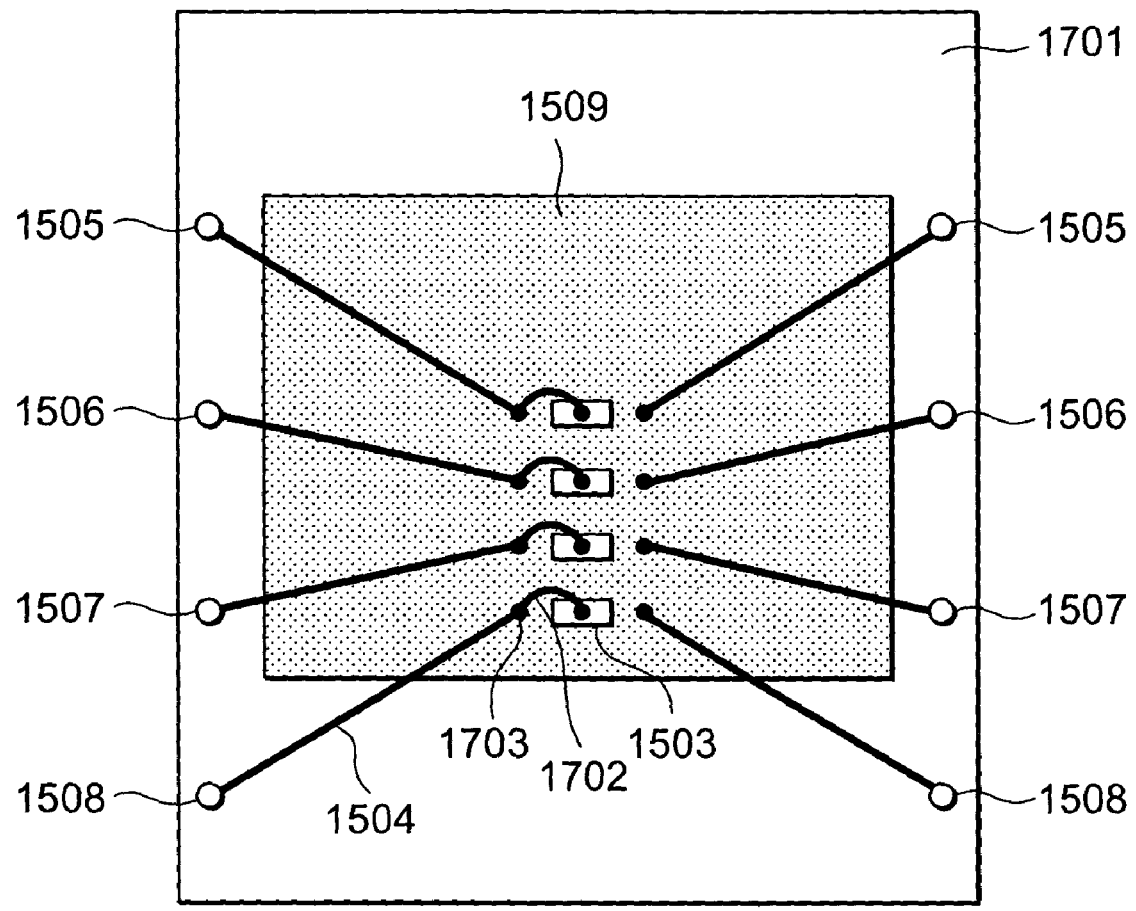
FIG. 20 is a plan view showing structure of a memory package of a second embodiment of a semiconductor unit according to a third aspect of this invention.

FIG. 20 shows another embodiment of a memory package for use in the memory module illustrated in FIG. 19. This memory package has input/output signal terminals at both sides of right and left of the memory package one by one and has pads in the vicinity of both side of right and left of input/output chip pads. A wiring is made between the input/output signal terminals and the pads in the vicinity of the input/output signal chip pads and the pads in the vicinity of the chip pads at either right or left are connected to the input/output signal chip pads by wiring bonding. For example, a wiring is made between an input/output signal terminal 1508 and a pad 1703 in the vicinity of the chip pad at a left-side and the pad 1703 is connected to an input/output signal chip pad 1503 using a bonding wire 1702. With this structure, it is possible to constitute the memory package similar to the memory package having effective input/output signal terminals at left-side illustrated in FIG. 18A.

Figure 21B:
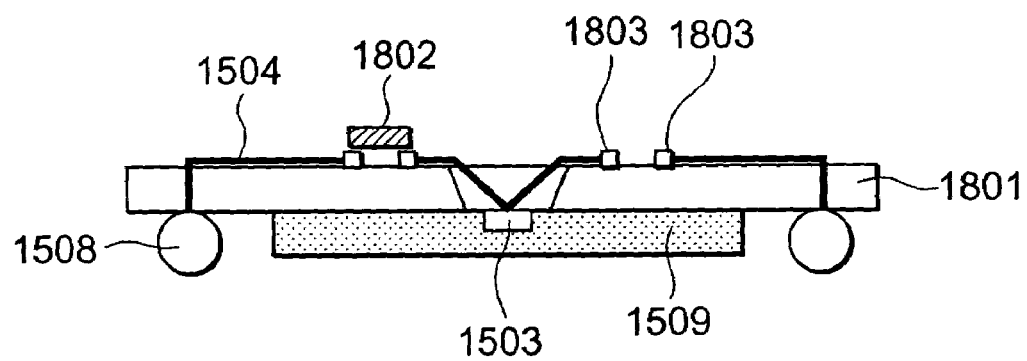
FIG. 21B is a sectional view of the memory package illustrated in FIG. 21A.

FIG. 21 shows still another embodiment of a memory package for use in the memory module illustrated in FIG. 19. This embodiment uses jumper chips in lieu of the wiring bonding of the memory package illustrated in FIG. 20. This package has terminals and a chip on a back face of a package substrate 1804 and wires, jumper pad pairs, and the jumper chips on a surface of the package substrate 1804. Although this package has the terminals at both side of right and left of the package and the wires are made from the terminals at both sides of right and left to the input/output signal chip pads in the similar manner to the memory package illustrated in FIG. 20, the wires are divided at pad pairs 1803 for the jumper chips on the way. By connecting, for example, the pad pairs for the jumper chips at left-side with jumper chips 1802, it is possible to constitute a package having effective input/output signal terminals at left-side of the package. To the contrary, the chip may be disposed on the surface of the package and the wires, the jumper pad pairs, and the jumper chips may be disposed on the back fade of the package.

Figure 22:
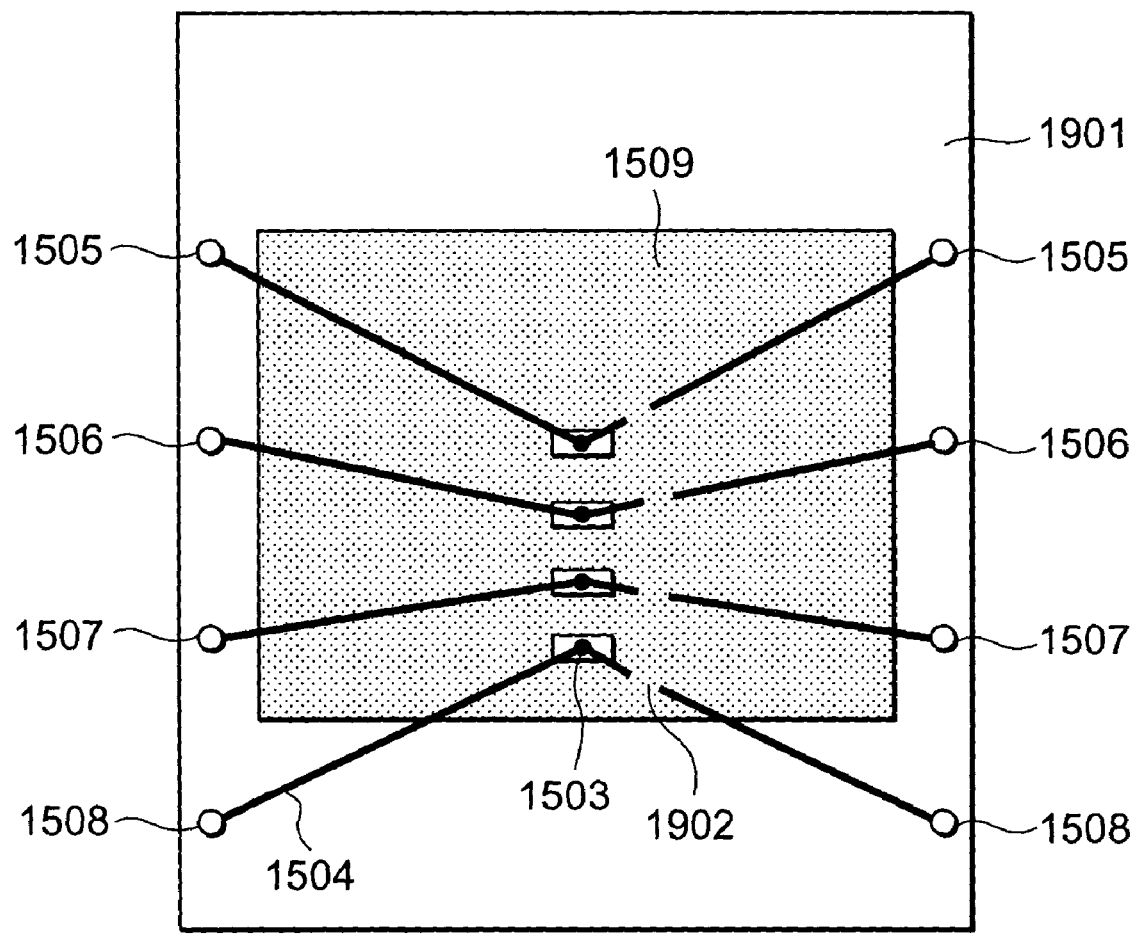
FIG. 22 is a plan view showing structure of a memory package of a fourth embodiment of a semiconductor unit according a third aspect of this invention.

FIG. 22 shows yet another embodiment of a memory package for use in the memory module illustrated in FIG. 19. This package has terminals at both sides of right and left of the package and wires made from input/output signal terminals at both sides of right and left to input/output signal chip pads in the similar manner of the memory package illustrated in FIG. 20. The wires from the input/output signal terminals at the right-hand are cut at the vicinity 1902 of the input/output signal chip pads. With this structure, it is possible to constitute a package having effective input/output signal terminals at the left-side.

Although description is made about the memory package having the effective input/output signal terminals at the left-side of the package, it is possible to realize a memory package having effective input/output signal terminals at a right-side of the package in the similar manner which is described above. A power-supply GND layer may be disposed in the package and a wire may be formed as transmission lines.

FIGS. 23A and 23B are sectional views showing an embodiment of a memory package according to a fourth aspect for use in the memory module illustrated in FIG. 19.

As shown in FIG. 23A, a memory package 2000 mainly comprises a package substrate 1804, a memory chip 1509, and input/output signal terminals 2001 and 2002. The memory chip 1509 is mounted on a back face of the package substrate 1804. The input/output signal terminals 2001 and 2002 are disposed on a surface and the back surface of the package substrate 1804 at right and left. The input/output signal terminals 2001 and 2002 disposed on the surface and the back face of the package opposite to each other at a left-side of the package are connected to each other through a via hole 2003.

The memory chip 1509 has an input/output signal pad 1503 which is connected to the input/output signal terminals 2001 and 2002 using an intra-package wire 1504. A power-supply GND layer may be disposed in the package and the intra-package wiring may be formed as a transmission line. Inasmuch as the memory package has common input/output signal terminals at two sides at either left-side or right-side of the memory package, on mounting the package 2000 on a memory module 1601 as illustrated in FIG. 23B, the package 2000 can use as a package having effective input/output signal terminals at a left-side of the package when the package 2000 is mounted on the memory module 1601 in the right side while the package 2000 can use as a package having effective input/output signal terminals at a right-side of the package when the package 2000 is mounted on the memory module 1601 in the back.

Figure 24A:
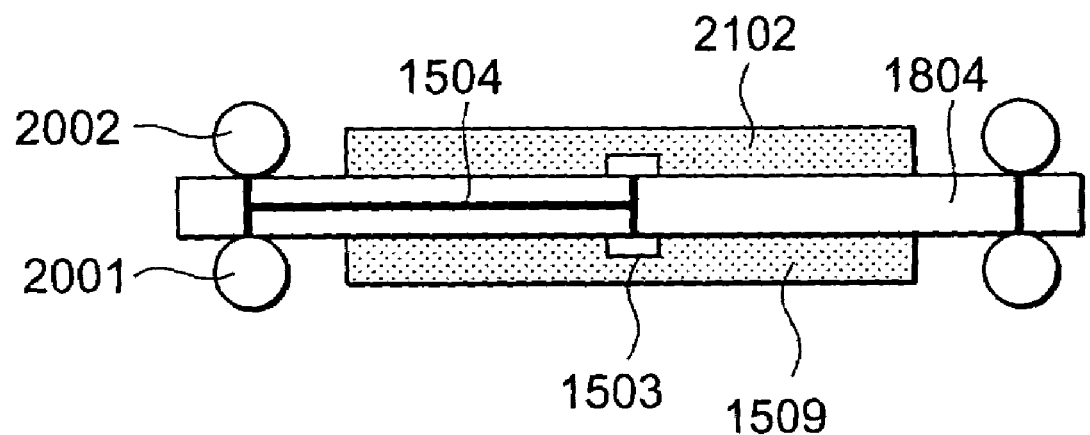
FIGS. 24A and 24B are sectional views showing structure of a memory package of a second embodiment of a semiconductor unit according to a fourth aspect of this invention.
Figure 24B:
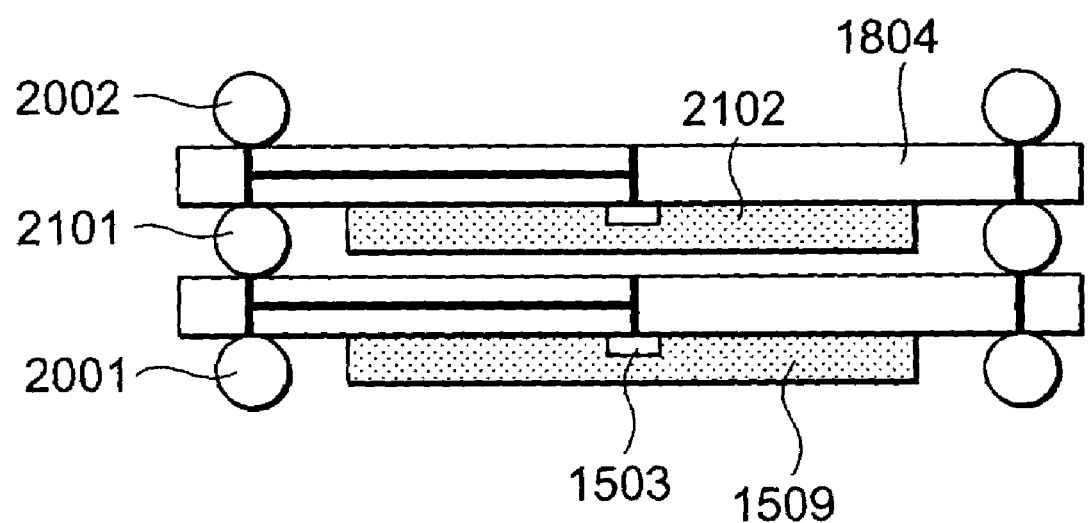

As shown in FIG. 24A, the memory package may have a structure where memory chips 1509 are mounted on both sides of the package substrate 1804. As shown in FIG. 24B, the memory package may have a laminated structure where package substrates 1804 are laminated through balls 2101 used to the input/output signal terminal of the package.

Figure 25:
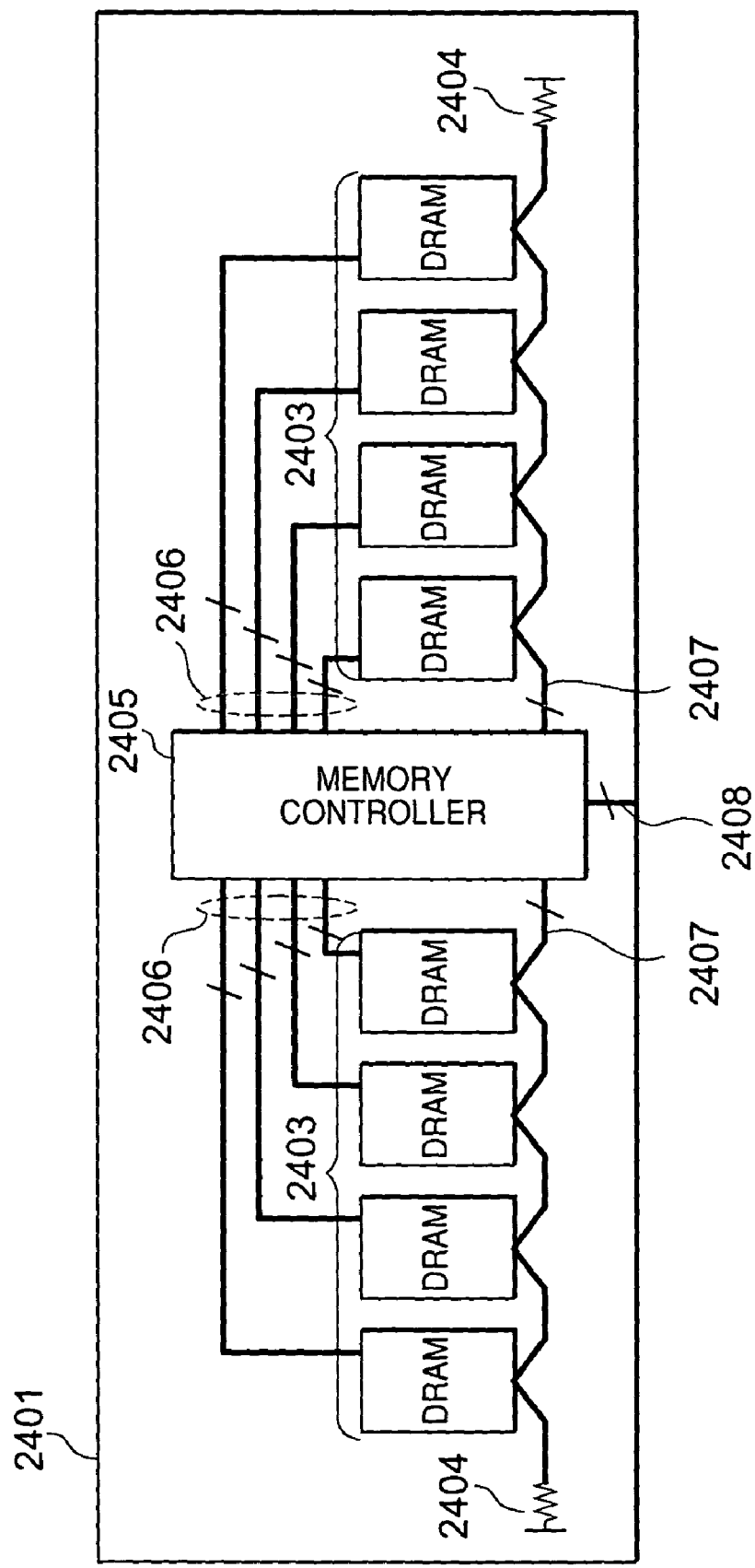
FIG. 25 is a block diagram showing structure of a memory system which uses a one-to-one connection bus together a one stroke connection bus.

FIG. 25 shows an example of a memory system which use jointly a one-to-one connection bus and a signal stroke connection bus. A memory device 2401 comprises a memory controller 2405 and a plurality of memories 2403 on both sides of the memory controller at right and left. The memory device 2401 further comprises one-to-one connection buses 2406 and signal stroke connection buses 2407 for connecting the memory controller 2405 with the plurality of memories 3403. The one-to-one connection bus may use for a data signal and a data strobe signal while the signal stroke connection bus may use for a command address signal and a clock signal. The one-to-one connection bus may use for a clock signal while the signal stroke connection bus may use for a data command address signal.

FIGS. 26A, 26B, and 26C show an embodiment of a laminated memory 2501 for use in the memory device illustrated in FIG. 25. FIG. 26A is a plan view showing the laminated memory 2501. FIG. 26B is a sectional view at a wiring area 2504 of the laminated memory 2501. FIG. 26C is a sectional view at a wiring area 2503 of the laminated memory 2501.

This memory is similar to the semiconductor unit according to the first aspect of this invention at the wiring area 1503 in the memory illustrated in FIG. 24A and chip pads 1503 are wired to terminals 2505 on both sides of the semiconductor unit at right and left. The wiring area 2504 is similar to the semiconductor unit according to the fourth aspect of this invention and chip pads 1503 are wired to terminals 2506 on one side (left) of the semiconductor unit. The terminals 2505 may use terminals for the single stroke connection bus 2407 of the memory device illustrated in FIG. 25. The terminals 2506 may use terminals for the one-to-one connection bus 2406.

Figure 27A:
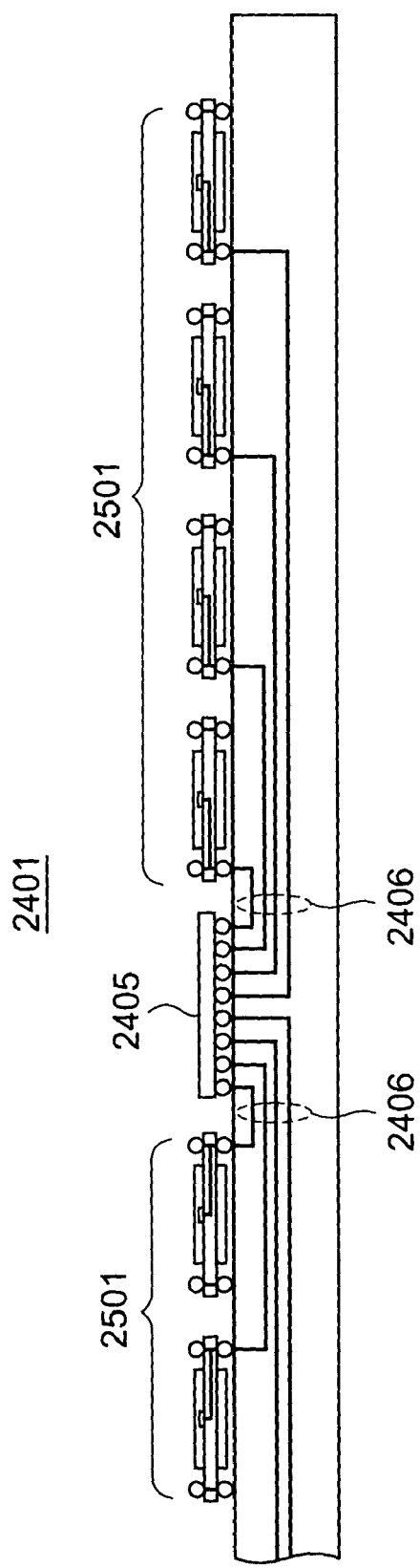
FIGS. 27A and 27B are sectional views of a memory device which uses a one-to-one connection bus together a one stroke connection bus, using the first embodiment of a memory having both the first and the fourth aspects of this invention.
Figure 27B:
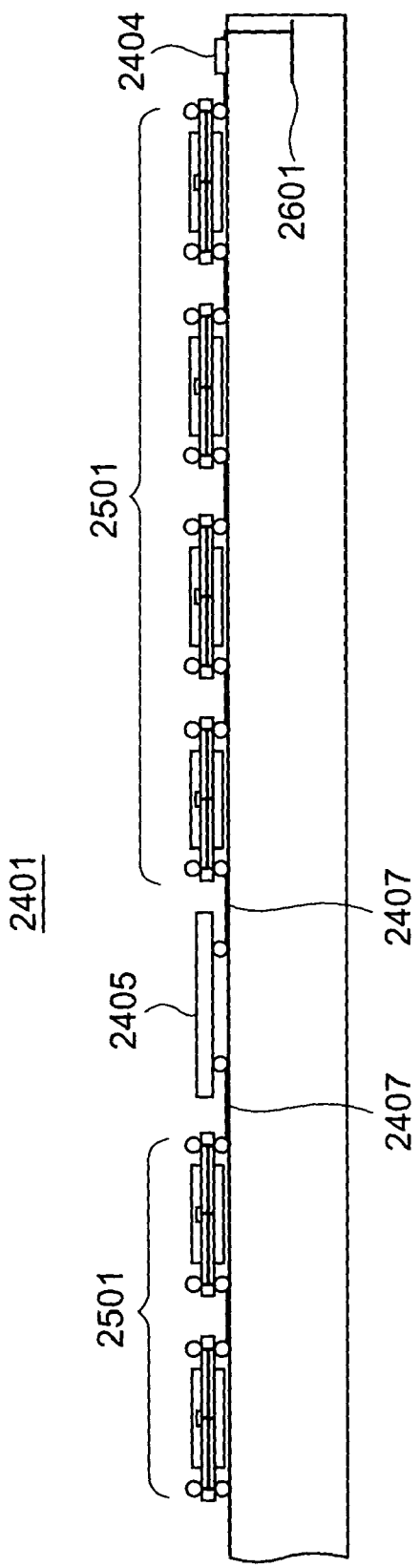

FIGS. 27A and 27B show an example to which the memory illustrated in FIGS. 26A through 26C is applied to the memory device illustrated in FIG. 25.

FIG. 27A is a sectional view related to the one-to-one connection bus 2406. As shown in FIG. 27A, the one-to-one connection bus 2406 is formed in a substrate internal layer. Inasmuch as the signal terminals 2506 for the one-to-one connection bus of the memory 2501 arranged in a right-side of the memory controller 2405 are disposed in near side (left-side) to the memory controller of the memory, it is possible to wire up to the chip pads of the memory at a short distance. The memories 2501 disposed at left-side of the memory controller 2405 are mounted with they turned over. Therefore, the signal terminals 2506 for the one-to-one connection bus of the memories 2501 are disposed in near side (right-side) to the memory controller 2405, it is possible to wire up to the chip pads of the memories at a short distance.

FIG. 27B is a sectional view related to the single stroke connection bus 2407. The signal stroke connection bus 2407 is formed on a substrate surface layer and is connected to the terminals for the single stroke connection bus on both sides of the memories at right and left, and comprises a line of wires extending from the memory controller 2405 to the terminating resistor 2404 through wires in the memories.

Figure 28A:
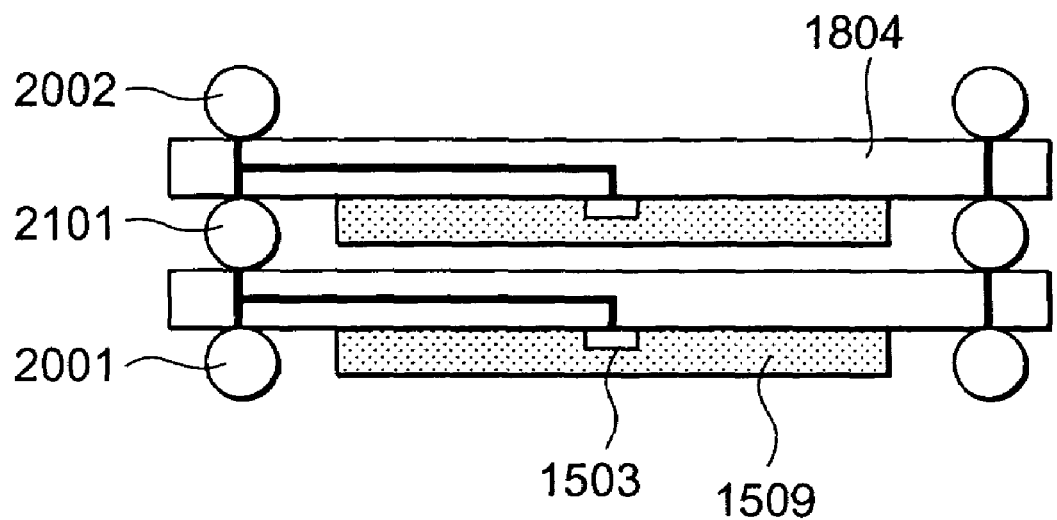
FIGS. 28A and 28B are sectional views of a second embodiment of a laminated memory having both the first and the forth aspects of this invention.
Figure 28B:
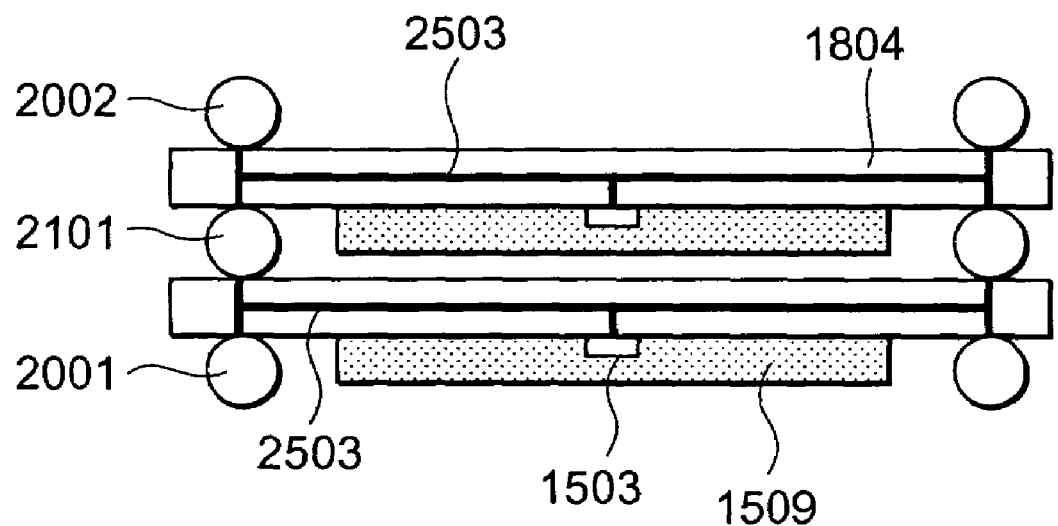

Although each memory 2501 comprises a memory obtained by altering the memory illustrated in FIG. 24A, each memory 2501 may comprise a memory obtained by altering the memory illustrated in FIG. 24B as shown in FIGS. 28A and 28B. Although wires are comprised as transmission liens, description of the ground plane and the power-supply plane is omitted from figures. The memory system 2401 may be comprised as a memory module.

FIGS. 29A, 29B, and 29C show different embodiment of a semiconductor device according to this invention. This is a structure where the semiconductor devices illustrated in FIGS. 26A through 26C are laminated through solder balls and four semiconductor chips are mounted.

FIG. 29A is a sectional view of the semiconductor device where a device of a lower layer has a wiring for the one-to-one connection bus. This device comprises a printed board 2801 of a lower layer and a printed board 2802 of an upper layer. The printed board 2801 of the lower layer has a main surface on which a semiconductor chip 2804 is mounted and a back surface on which a semiconductor chip 2803 and device terminals are mounted. Solder balls 2811 and the device terminals 2809 are electrically connected to each other through via holes 2810. The printed board 2802 of the upper layer has a main surface on which a semiconductor chip 2806 and device terminals 2803 are mounted and a back surface on which a semiconductor chip 2805 is mounted. The device terminals 2813 and the solder balls 2811 are electrically connected to each other through via holes 2812. In the printed board 2801, a wire 2812 is connected to the via holes 2810, a chip pad 2807 of the semiconductor chip 2803, a chip pad 2808 of the semiconductor chip 2804. It is desirable that the chip pad 2807 of the semiconductor chip 2803 and the chip pad 2808 of the semiconductor chip 2804 are connected to each other through a via hole which is connected to the wire 2812.

FIG. 29B is a sectional view of the semiconductor device where a device of an upper layer has a wiring for the one-to-one connection bus. The printed board 2801 of the lower layer has a back surface on which device terminals 2821 are mounted. Solder balls 2823 and the device terminals 2821 are electrically connected to each other through via holes 2822. The printed board 2802 of the upper layer has a main surface on which device terminals 2825 are mounted. The device terminals 2825 and the solder balls 2823 are electrically connected to each other through via holes 2824. In the printed board 2802 of the upper layer, a wire 2826 is connected to the via hole 2824, a chip pad 2827 of the semiconductor 2805, and a chip pad 2828 of the semiconductor chip 2806. It is desirable that the chip pad 2827 of the semiconductor chip 2805 and the chip pad 2828 of the semiconductor chip 2806 are connected to each other through a via hole which is connected to the wire 2826.

FIG. 29C is a sectional view of the semiconductor device where devices of upper and lower layers have wires for the single stroke connection bus in parallel. The device of the lower layer has a back surface on which device terminals 2831 and 2842 are formed and a main surface on which solder balls 2833 and 2844 are formed. The solder ball 2833 and the device terminal 2831 are electrically connected to each other through a via hole 2832 while the solder ball 2844 and the device terminal 2842 are electrically connected to each other through a via hole 2843. The printed board 2801 has a wiring 2838 which connects the via hole 2832, a chip pad 2836 of the semiconductor chip 2803, a chip pad 2804 of the semiconductor chip 2804, and the via hole 2843 with one stroke. It is desirable that the chip pads 2836 and 2837 are connected to each other through a via hole of the printed board 2801 of the lower layer.

The device of the upper layer has a main surface on which device terminals 2835 and 2846 are formed and a back surface on which the solder balls 2833 and 2844 are formed. The solder ball 2833 and the device terminal 2835 are electrically connected to each other through a via hole 2834 while the solder ball 2844 and the device terminal 2846 are electrically connected to each other through a via hole 2845. The printed board 2802 of the upper layer has a wiring 2839 which connects the via hole 2834, a chip pad 2840 of the semiconductor chip 2805, a chip pad 2841 of the semiconductor chip 2806, and the via hole 2845 with one stroke. It is desirable that the chip pads 2840 and 2841 are connected to each other through a via hole of the printed board 2802 of the upper layer.

It is desirable that a cushioning material is sandwiched between the semiconductor chips 2804 and 2805 from the point of view of stress and heat. It is desirable to protect or remove from short-circuiting to the outside by covering the device terminals 2813, 2835, and 2846 exposed in the device of the upper layer with insulator on mounting the laminated device on the memory module. In order to match an effective characteristic impedance of the wires of the semiconductor device with a characteristic impedance of the wires connected to the device terminal, it is desirable that a following relationship is satisfied:

$$2 \cdot Z_{MB} = \sqrt{\frac{L_0}{(C_0 + C_{in})/l}}$$

where l represents a length of the wires 2838 and 2839, L0 represents an inductance per unit length, $C_0$ represents a capacitance per unit length, $C_{in}$ represents a load capacitance in the chip pad of the semiconductor chip, and $Z_{MB}$ represents a characteristic impedance of the wiring connected to the device terminal.

While this invention has thus far been described in conjunction with preferred embodiments thereof, it will now be readily possible for those skilled in the art to put this invention into various other manners.

What is claimed is:

1. A semiconductor module comprising:
   a module substrate comprising a connector and intra-module wires connected to said connector, said module substrate having a main surface and a back surface; and
   a plurality of semiconductor units being mounted on the main surface and the back surface of said module substrate, respectively, said plurality of semiconductor units being connected to said intra-module wires, each of said semiconductor units having two device terminals every one input/output signal, each of said semiconductor units comprising:

a laminated substrate comprising at least two wiring layers which include a signal wiring layer and a power-supply or ground wiring layer, said laminated substrate having a main surface; and a semiconductor chip having an input/output pad and being mounted on the main surface of said laminated substrate through said input/output pad, said two device terminals being mounted on said laminated substrate and being connected to both ends of a signal wire in said signal wiring layer, said signal wire being connected to the input/output pad of said semiconductor chip through a via hole, one pair of said two device terminals in two semiconductor units disposed on the main surface and the back surface of said module substrate opposite to each other being connected to each other through a via hole, another pair of said two device terminals in the two semiconductor units disposed on the main surface and the back surface of said module substrate opposite to each other being connected to said connector through intra-module wires disposed in the main surface and the back surface of said module substrate, respectively.

2. A semiconductor module as claimed in claim 1, wherein said semiconductor chip comprises an input/output circuit corresponding to said input/output pad, said input/output circuit comprising at least one of an input buffer and an output buffer, an input protection resistor, and an electrostatic protection element.

3. A semiconductor module as claimed in claim 1, wherein said signal wiring layer forms a micro-strip line with the ground wiring layer in said laminated substrate, said ground wiring layer being disposed between said signal wiring layer and said semiconductor chip.

4. A semiconductor module as claimed in claim 1, wherein said signal wiring layer being sandwiched between the power-supply layer and the ground layer in said laminated substrate, said signal wiring layer forming a strip line with the power-supply layer or the ground layer.

5. A semiconductor module as claimed in claim 2, wherein said semiconductor unit is operable in response to a clock signal, a distance L between said input/output circuit and said signal wire being satisfied to a cycle time tck of the clock signal determined by a product specification of said semiconductor unit with a relationship as follows:

$$2 \times 2L \times 7 \text{ ns/m} < tck/10.$$

6. A semiconductor module as claimed in claim 1, wherein said module substrate comprises at least two wiring layers.

7. A semiconductor module as claimed in claim 1, wherein said semiconductor units comprise memory devices.

8. A semiconductor module as claimed in claim 7, wherein said semiconductor module further comprises a register, a control wiring between said register and a plurality of memory devices passing through between said two device terminals.

9. A semiconductor unit, comprising:

a laminated substrate comprising at least two wiring layers including a signal wiring layer and a power supply or a ground wiring layer, said laminated substrate having a main surface and a back surface:

two semiconductor chips each having an input/output pad, said semiconductor chips being mounted on the main surface and the back surface of said laminated substrate, respectively; and different four device terminals for every one input/output signal, first and second terminals in said different four device terminals being disposed on the main and the back surfaces of said laminated substrate at left side opposite to each other, third and fourth terminals of said different four device terminals being disposed on the main and the back surfaces of said laminated substrate at right side opposite to each other, said first and said second terminals and said third and said fourth terminals being disposed at left and right of said laminated substrate opposite to each other, said first and said second terminals being connected to each other through a first via hole, said third and said fourth terminals being connected to each other through a second via hole, said first and said second via holes being connected to a corresponding signal pad of said semiconductor chip by a wire, respectively, wherein the first via hole, the second via hole and the wire are formed in said laminated substrate.

10. A semiconductor unit having two device terminals for every one input/output signal, said semiconductor unit comprising:

a laminated substrate comprising at least two wiring layers which include a signal wiring layer and a power-supply or ground wiring layer, said laminated substrate having a main surface; and a semiconductor chip having an input/output pad and being mounted on the main surface of said laminated substrate through said input/output pad, said two device terminals being mounted on said laminated substrate and being connected to both ends of a signal wire in said signal wiring layer, said signal wire being connected to the input/output pad of said semiconductor chip through a via hole, wherein said semiconductor chip comprises an input/output circuit corresponding to said input/output pad, said input/output circuit comprising at least one of an input buffer and an output buffer, an input protection resistor, and an electrostatic protection element, and wherein said semiconductor unit is operable in response to a clock signal, a distance L between said input/output circuit and said signal wire being satisfied to a cycle time tck of the clock signal determined by a product specification of said semiconductor unit with a relationship as follows:

$$2 \times 2L \times 7 \text{ ns/m} < tck/10.$$

* * * * *